US012622099B2

(12) United States Patent
Yoon

(10) Patent No.: US 12,622,099 B2
(45) Date of Patent: May 5, 2026

(54) SEMICONDUCTOR LIGHT EMITTING DEVICE AND LIGHT EMITTING DEVICE PACKAGE INCLUDING THE SAME

(71) Applicant: SAMSUNG ELECTRONICS CO., LTD., Suwon-si (KR)

(72) Inventor: Youngwoo Yoon, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 805 days.

(21) Appl. No.: 17/501,672

(22) Filed: Oct. 14, 2021

(65) Prior Publication Data

US 2022/0190201 A1 Jun. 16, 2022

(30) Foreign Application Priority Data

Dec. 16, 2020 (KR) ........................ 10-2020-0176694

(51) Int. Cl.
*H10H 20/82* (2025.01)
*H10H 20/812* (2025.01)
(Continued)

(52) U.S. Cl.
CPC .......... *H10H 20/82* (2025.01); *H10H 20/856* (2025.01); *H10H 20/812* (2025.01);
(Continued)

(58) Field of Classification Search
CPC ......... H01L 33/22; H01L 33/60; H01L 33/40; H01L 33/10; H01L 33/50; H01L 33/382; H01L 33/385
See application file for complete search history.

(56) References Cited

U.S. PATENT DOCUMENTS 6,372,608 B1 4/2002 Shimoda et al.
6,645,830 B2 11/2003 Shimoda et al.
(Continued)

FOREIGN PATENT DOCUMENTS

CN 207637833 U * 7/2018 ............. H01L 33/10
CN 109075184 B * 7/2023 ......... H01L 25/0753
(Continued)

OTHER PUBLICATIONS

Communication issued Nov. 27, 2024 by the German Patent and Trademark Office in German Patent Application No. 102021131751. 7.

*Primary Examiner* — Monica D Harrison
*Assistant Examiner* — Moataz Khalifa
(74) *Attorney, Agent, or Firm* — Sughrue Mion, PLLC

(57) ABSTRACT

A semiconductor light emitting device is provided. The semiconductor light emitting device includes: a substrate structure; a light emitting structure including a first conductivity-type semiconductor layer, an active layer, and a second conductivity-type semiconductor layer sequentially provided on the substrate structure, wherein a hole penetrates through the first conductivity-type semiconductor layer and the active layer to expose the second conductivity-type semiconductor layer, and uneven portions are provided on a surface of the second conductivity-type semiconductor layer; a dam structure provided adjacent a portion of the light emitting structure on the substrate structure; a first electrode provided between the substrate structure and the light emitting structure, and connected to the first conductivity-type semiconductor layer; and a second electrode provided in the hole between the substrate structure and the light emitting structure, and connected to the second conductivity-type semiconductor layer. The first conductivity-
(Continued)

type semiconductor layer extends through the light emitting structure and the dam structure.

20 Claims, 22 Drawing Sheets

(51) Int. Cl.

| | |
|---|---|
| *H10H 20/819* | (2025.01) |
| *H10H 20/821* | (2025.01) |
| *H10H 20/825* | (2025.01) |
| *H10H 20/831* | (2025.01) |
| *H10H 20/85* | (2025.01) |
| *H10H 20/851* | (2025.01) |
| *H10H 20/854* | (2025.01) |
| *H10H 20/856* | (2025.01) |

(52) U.S. Cl.
CPC ....... *H10H 20/825* (2025.01); *H10H 20/8312* (2025.01); *H10H 20/8314* (2025.01); *H10H 20/851* (2025.01)

(56) References Cited

U.S. PATENT DOCUMENTS

| | | | |
|---|---|---|---|
| RE38,466 | E | 3/2004 | Inoue et al. |
| 6,818,465 | B2 | 11/2004 | Biwa et al. |
| 6,818,530 | B2 | 11/2004 | Shimoda et al. |
| 6,858,081 | B2 | 2/2005 | Biwa et al. |
| 6,967,353 | B2 | 11/2005 | Suzuki et al. |
| 7,002,182 | B2 | 2/2006 | Okuyama et al. |
| 7,084,420 | B2 | 8/2006 | Kim et al. |
| 7,087,932 | B2 | 8/2006 | Okuyama et al. |
| 7,154,124 | B2 | 12/2006 | Han et al. |
| 7,208,725 | B2 | 4/2007 | Sherrer et al. |
| 7,288,758 | B2 | 10/2007 | Sherrer et al. |
| 7,319,044 | B2 | 1/2008 | Han et al. |
| 7,501,656 | B2 | 3/2009 | Han et al. |
| 7,709,857 | B2 | 5/2010 | Kim et al. |
| 7,759,140 | B2 | 7/2010 | Lee et al. |
| 7,781,727 | B2 | 8/2010 | Sherrer et al. |
| 7,790,482 | B2 | 9/2010 | Han et al. |
| 7,940,350 | B2 | 5/2011 | Jeong |
| 7,959,312 | B2 | 6/2011 | Yoo et al. |
| 7,964,881 | B2 | 6/2011 | Choi et al. |
| 7,985,976 | B2 | 7/2011 | Choi et al. |
| 7,994,525 | B2 | 8/2011 | Lee et al. |
| 8,008,683 | B2 | 8/2011 | Choi et al. |
| 8,013,352 | B2 | 9/2011 | Lee et al. |
| 8,049,161 | B2 | 11/2011 | Sherrer et al. |
| 8,129,711 | B2 | 3/2012 | Kang et al. |
| 8,179,938 | B2 | 5/2012 | Kim |
| 8,263,987 | B2 | 9/2012 | Choi et al. |
| 8,287,148 | B2 | 10/2012 | Mizuno |
| 8,324,646 | B2 | 12/2012 | Lee et al. |
| 8,399,944 | B2 | 3/2013 | Kwak et al. |
| 8,432,511 | B2 | 4/2013 | Jeong |
| 8,459,832 | B2 | 6/2013 | Kim |
| 8,502,242 | B2 | 8/2013 | Kim |
| 8,536,604 | B2 | 9/2013 | Kwak et al. |
| 8,735,931 | B2 | 5/2014 | Han et al. |
| 8,766,295 | B2 | 7/2014 | Kim |
| 8,969,887 | B2 | 3/2015 | Kim |
| 10,490,709 | B2 | 11/2019 | Ko |
| 10,600,942 | B2 | 3/2020 | Beppu et al. |
| 10,629,783 | B2 | 4/2020 | Oka |
| 10,727,210 | B2 | 7/2020 | Herner |
| 2005/0199884 | A1 | 9/2005 | Lee et al. |
| 2011/0089451 | A1* | 4/2011 | Jeong ..................... H01L 33/40 |
| | | | 257/E33.056 |
| 2016/0087173 | A1 | 3/2016 | Mayer et al. |
| 2017/0033085 | A1 | 2/2017 | Shikibu et al. |
| 2018/0138157 | A1 | 5/2018 | Im et al. |
| 2018/0198045 | A1* | 7/2018 | Perzlmaier ........... H10H 20/853 |
| 2018/0350788 | A1 | 12/2018 | Rafael et al. |
| 2018/0351057 | A1* | 12/2018 | Seo ..................... H10H 20/821 |
| 2019/0088564 | A1 | 3/2019 | Tai et al. |

FOREIGN PATENT DOCUMENTS

| | | |
|---|---|---|
| DE | 10 2004 034 536 A1 | 10/2005 |
| DE | 10 2015 120 642 A1 | 6/2017 |
| DE | 11 2016 004 262 T5 | 6/2018 |
| EP | 3 364 469 A1 | 8/2018 |
| JP | 6511809 B2 | 5/2019 |
| KR | 10-2012-0070988 A | 7/2012 |
| KR | 10-2015-0000387 A | 1/2015 |

* cited by examiner

SEMICONDUCTOR LIGHT EMITTING DEVICE AND LIGHT EMITTING DEVICE PACKAGE INCLUDING THE SAME

CROSS-REFERENCE TO RELATED APPLICATION(S)

This application claims priority to Korean Patent Application No. 10-2020-0176694 filed on Dec. 16, 2020 in the Korean Intellectual Property Office, the disclosure of which is incorporated by reference herein in its entirety.

BACKGROUND

The present disclosure relates to a semiconductor light emitting device and a light emitting device package including the same.

A semiconductor light emitting device, such as a semiconductor light emitting diode (LED), has advantages such as a long lifespan, low power consumption, fast response speeds, environmental friendliness. In particular, because such a semiconductor light emitting device has excellent luminous flux, it is attracting attention as a main light source of various products such as electric/electronic devices and lighting devices.

SUMMARY

Example embodiments provide a semiconductor light emitting device having improved light extraction efficiency and a light emitting device package including the semiconductor light emitting device.

According to an aspect of an example embodiment, a semiconductor light emitting device includes: a substrate structure; a light emitting structure including a first conductivity-type semiconductor layer, an active layer, and a second conductivity-type semiconductor layer sequentially provided on the substrate structure, wherein a hole penetrates through the first conductivity-type semiconductor layer and the active layer to expose the second conductivity-type semiconductor layer, and uneven portions are provided on a surface of the second conductivity-type semiconductor layer; a dam structure provided adjacent a portion of the light emitting structure on the substrate structure; a first electrode provided between the substrate structure and the light emitting structure, and connected to the first conductivity-type semiconductor layer; and a second electrode provided in the hole between the substrate structure and the light emitting structure, and connected to the second conductivity-type semiconductor layer. The first conductivity-type semiconductor layer extends through the light emitting structure and the dam structure.

According to an aspect of an example embodiment, a light emitting device package includes: a package substrate; a semiconductor light emitting device provided on the package substrate; a wavelength conversion portion provided on the semiconductor light emitting device; and a reflective resin portion provided on the package substrate adjacent the semiconductor light emitting device and the wavelength conversion portion. The semiconductor light emitting device includes: a substrate structure; a light emitting structure including a first conductivity-type semiconductor layer, an active layer, and a second conductivity-type semiconductor layer sequentially provided on the substrate structure, wherein a hole penetrates through the first conductivity-type semiconductor layer and the active layer to expose the second conductivity-type semiconductor layer, and uneven portions are provided on a surface of the second conductivity-type semiconductor layer; a dam structure provided adjacent a portion of the light emitting structure on the substrate structure; a first electrode provided between the substrate structure and the light emitting structure, and connected to the first conductivity-type semiconductor layer; and a second electrode provided in the hole between the substrate structure and the light emitting structure and connected to the second conductivity-type semiconductor layer. An external side surface of the dam structure is in contact with the reflective resin portion.

According to an aspect of an example embodiment, a light emitting device package includes: a package substrate; a semiconductor light emitting device provided on the package substrate; a wavelength conversion portion provided on the semiconductor light emitting device; and a reflective resin portion provided on the package substrate adjacent the semiconductor light emitting device and the wavelength conversion portion. The semiconductor light emitting device includes: a light emitting structure including a first conductivity-type semiconductor layer, a second conductivity-type semiconductor layer, and an active layer provided between the first conductivity-type semiconductor layer and the second conductivity-type semiconductor layer; a dam structure provided adjacent a portion of the light emitting structure; a first electrode connected to the first conductivity-type semiconductor layer; and a second electrode connected to the second conductivity-type semiconductor layer. The dam structure is provided between the light emitting structure and the reflective resin portion.

BRIEF DESCRIPTION OF DRAWINGS

The above and other aspects, features, and advantages will be more clearly understood from the following description, taken in conjunction with the accompanying drawings in which.

DETAILED DESCRIPTION

Hereinafter, example embodiments will be described as follows with reference to the attached drawings.

Unless otherwise indicated, the spatially relative terms, "upper," "upper surface," "lower," "lower surface," "side surface," and the like, are used herein based on the drawings. It will be understood that the spatially relative terms are intended to encompass different orientations of the device in use or operation in addition to the orientation depicted in the figures.

Figure 1A:
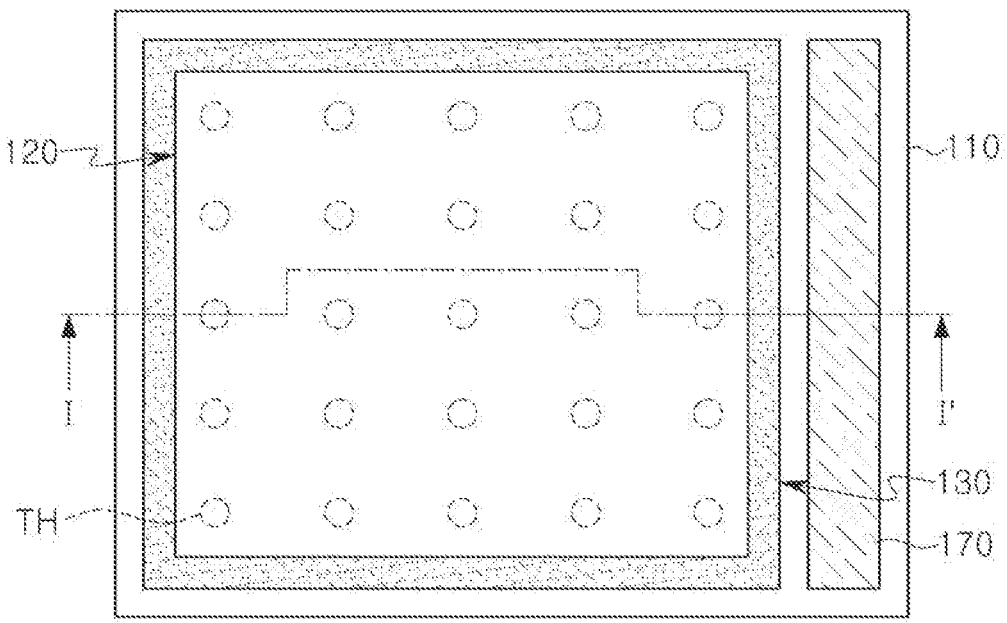
FIGS. 1A and 1B are a plan view and a cross-sectional view, respectively, of a semiconductor light emitting device according to example embodiments.
Figure 1A:
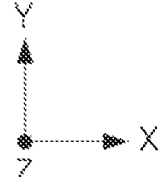
Figure 1B:
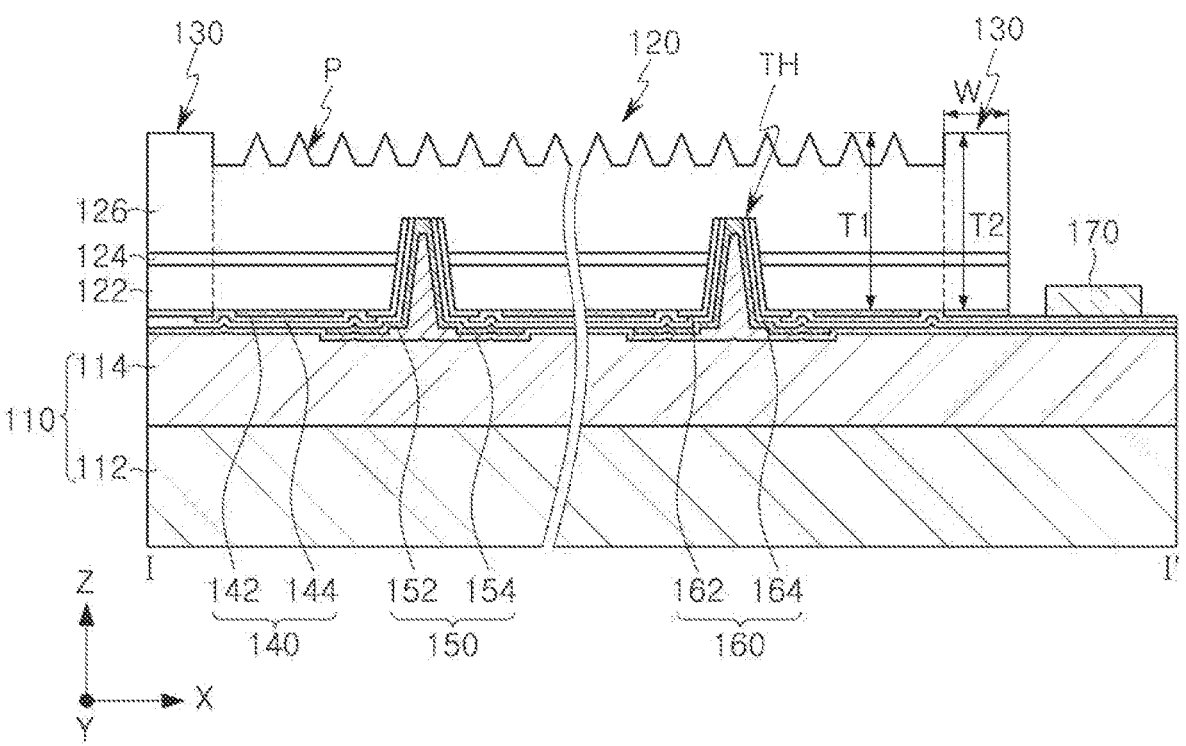

FIGS. 1A and 1B are a plan view and a cross-sectional view, respectively, of a semiconductor light emitting device according to example embodiments. FIG. 1B is a cross-sectional view taken along line I-I' of FIG. 1A.

Referring to FIGS. 1A and 1B, a semiconductor light emitting device 100 may include a substrate structure 110, a light emitting structure 120 provided on the substrate structure 110, a dam structure 130 surrounding the light emitting structure 120, a first electrode 140 and a second electrode 150 connected to the light emitting structure 120, an interlayer insulating layer 160 in contact with the first electrode 140 and the second electrode 150, and an electrode pad 170 electrically connected to the first electrode 140.

The substrate structure 110 may be a conductive structure, and may include a support substrate 112 and a bonding metal layer 114 stacked vertically. The substrate structure 110 may be connected to the second electrode 150 to function as an electrode pad, and may be electrically connected to a second conductivity-type semiconductor layer 126. For example, the support substrate 112 may be a conductive substrate including a silicon (Si) substrate, and the bonding metal layer 114 may include gold (Au), tin (Sn), nickel (Ni), Au—Sn, Ni—Sn, or Ni—Au—Sn.

The light emitting structure 120 may include a first conductivity-type semiconductor layer 122, an active layer 124, and a second conductivity-type semiconductor layer 126 disposed sequentially on the substrate structure 110 in a Z direction. The light emitting structure 120 may have a plurality of holes TH connected to the second conductivity-type semiconductor layer 126 through the first conductivity-type semiconductor layer 122 and the active layer 124. The light emitting structure 120 may have uneven portions P for improving light extraction efficiency on a surface of the second conductivity-type semiconductor layer 126. The surface of the second conductivity-type semiconductor layer 126 that has the uneven portions P may by an upper surface of the light emitting structure 120. The size and shape of the uneven portions P may vary in example embodiments.

The first conductivity-type semiconductor layer 122, the active layer 124, and the second conductivity-type semiconductor layer 126 may be formed of a nitride semiconductor, and the light emitting structure 120 may be a nitride light emitting structure. The first and second conductivity-type semiconductor layers 122 and 126 may be nitride semiconductor layers having compositions of n-type or p-type $In_xAl_yGa_{1-x-y}N$ ($0 \le x < 1$, $0 \le y < 1$, $0 \le x+y < 1$). For example, the first conductivity-type semiconductor layer 122 may be an n-type gallium nitride (n-GaN) layer doped with silicon (Si) or carbon (C), and the second conductivity-type semiconductor layer 126 may be a p-type gallium nitride (p-GaN) layer doped with magnesium (Mg) or zinc (Zn). Example embodiments are not limited thereto, and the first and second conductivity-type semiconductor layers 122 and 126 may be formed of other materials, such as an aluminum gallium indium phosphide (AlInGaP) or aluminum gallium indium arsenide (AlInGaAs)-based semiconductor layer, in addition to a nitride semiconductor. Each of the first and second conductivity-type semiconductor layers 122 and 126 may be formed of a single layer, or may include a plurality of layers having different doping concentrations, compositions, or the like.

The active layer 124 may emit light having predetermined amount of energy by a recombination of electrons and holes. The active layer 124 may have a single quantum well (SQW) structure or a multiple quantum well (MQW) structure in which a quantum well layer and a quantum barrier layer are alternately disposed. For example, the quantum well layer and the quantum barrier layer may be $In_xAl_yGa_{1-x-y}N$ ($0 \le x \le 1$, $0 \le y \le 1$, $0 \le x+y \le 1$) layers having different compositions. For example, the quantum well layer may be an $In_xGa_{1-x}N$ ($0 < x \le 1$) layer, while the quantum barrier layer may be a GaN layer or an AlGaN layer.

The dam structure 130 may be disposed on the substrate structure 110 together with the light emitting structure 120, and may be disposed to surround at least a portion of the light emitting structure 120. As illustrated in FIG. 1A, the dam structure 130 may be disposed to completely surround the light emitting structure 120. The dam structure 130 may be configured to prevent light extraction efficiency from decreasing during a packaging process of the semiconductor light emitting device 100, which will be described in more detail later with reference to FIG. 5.

As illustrated in FIG. 1B, the dam structure 130 may be in contact with an external side surface of the light emitting structure 120, and may be connected to the light emitting structure 120. Specifically, the dam structure 130 may include at least one layer extending from the light emitting structure 120. The dam structure 130 may be formed by extending any one or any combination of the layers constituting the light emitting structure 120. As illustrated in FIG. 1B, the dam structure 130 may include a first conductivity-type semiconductor layer 122, an active layer 124, and a second conductivity-type semiconductor layer 126 extending from the light emitting structure 120. According to example embodiments, the dam structure 130 may include only the first conductivity-type semiconductor layer 122 or only the first conductivity-type semiconductor layer 122 and the active layer 124.

In contrast to the light emitting structure 120, the dam structure 130 may not have uneven portions P on an upper surface thereof and may have a substantially planar upper surface. Accordingly, a boundary between the dam structure 130 and the light emitting structure 120 may be recognized, and generated light may be mainly extracted through the light emitting structure 120.

The dam structure 130 may have a lower surface coplanar with a lower surface of the light emitting structure 120. A height T2 of the dam structure 130 may be the same as or different from a height T1 of the light emitting structure 120. As shown in FIG. 1B, the height T2 of the dam structure 130 may be substantially the same as the height T1 of the light emitting structure 120. In this case, the height T1 of the light emitting structure 120 may refer to a height including the uneven portions P. In the present specification, the phrase "substantially the same" includes a difference in the range caused by a deviation that may occur in a manufacturing process, and may be interpreted as the same meaning even when the expression "substantially" is omitted. According to example embodiments, the height T2 of the dam structure 130 may vary within the range of, for example, about 15% to about 120% of the height T1 of the light emitting structure 120. When the height T2 of the dam structure 130 is smaller than or larger than the above range, an effect of improving light extraction efficiency by the dam structure 130 may be insignificant. A width W of the dam structure 130 may vary in example embodiments. In example embodiments, the external side surface of the dam structure 130 may be vertical, or the dam structure 130 may have a side surface inclined such that the width of the dam structure 130 increases in a downward direction.

The first electrode 140 and the second electrode 150 may be disposed below the light emitting structure 120 to be electrically connected to the first conductivity-type semiconductor layer 122 and the second conductivity-type semiconductor layer 126, respectively.

The first electrode 140 may include first contact electrodes 142, disposed on a lower surface of the first conductivity-type semiconductor layer 122, and a first connection electrode 144 disposed on lower surfaces of the first contact electrodes 142 to connect the first contact electrodes 142 to each other. The first electrode 140 may be disposed between the light emitting structure 120 and the second electrode 150. The second electrode 150 may include second contact electrodes 152, connected to the second conductivity-type semiconductor layer 126 through a plurality of holes TH, and a second connection electrode 154 disposed on lower surfaces of the second contact electrodes 152 to connect the second contact electrodes 152 to each other. The number and arrangement form of layers, constituting the first electrode 140 and the second electrode 150, may vary in example embodiments.

The first electrode 140 and the second electrode 150 may be disposed below the light emitting structure 120, and may extend below the dam structure 130 in at least one side of the light emitting structure 120. In the first electrode 140, the first connection electrode 144 may include a region extending outwardly of the light emitting structure 120 to expose an upper surface. In the region, the first connection electrode 144 may be connected to the electrode pad 170. In the case of the second electrode 150, the substrate structure 110 may function as an electrode pad. The number, type, and shape of electrode pads, disposed outside the light emitting structure 120, may vary in example embodiments. For example, in addition to the electrode pad 170 connected to the first electrode 140 outside the light emitting structure 120, an electrode pad connected to the second electrode 150 may be further disposed. In this case, the substrate structure 110 may further include an insulating layer to electrically separation the substrate structure 110 from the second electrode 150.

Each of the first and second electrodes 140 and 150 may have a single-layer structure or a multilayer structure of a conductive material. For example, each of the first electrode 140, the second electrodes 150, and the electrode pad 170 may include any one or any combination of gold (Au), silver (Ag), copper (Cu), zinc (Zn), aluminum (Al), indium (In), titanium (Ti), silicon (Si), germanium (Ge), tin (Sn), magnesium (Mg), tantalum (Ta), chromium (Cr), tungsten (W), ruthenium (Ru), rhodium (Rh), iridium (Ir), nickel (Ni), palladium (Pd), platinum (Pt), or alloys thereof. According to example embodiments, any one or any combination of the first and second electrodes 140 or 150 may be a transparent electrode such as a transparent conductive oxide or a transparent conductive nitride, or may include graphene. For example, the second electrode 152 may include any one or any combination of indium tin oxide (ITO), zinc-doped indium tin oxide (ZITO), zinc indium oxide (ZIO), gallium indium oxide (GIO), zinc tin oxide (ZTO), fluorine-doped tin oxide (FTO), aluminum-doped zinc oxide (AZO), gallium-doped zinc oxide (GZO), $In_4Sn_3O_{12}$, or zinc magnesium oxide ($Zn_{1-x}Mg_xO$, $0 \le x \le 1$).

The interlayer insulating layer 160 may be disposed to be in contact with the first electrode 140 and/or the second electrode 150. The interlayer insulating layer 160 may include a first interlayer insulating layer 162, disposed between the first electrode 140 and the light emitting structure 120, and a second interlayer insulating layer 164 disposed between the first electrode 140 and the second electrode 150.

According to example embodiment, the interlayer insulating layer 160 may include at least one layer provided as a reflective insulating layer. For example, the reflective insulating layer may have a distributed Bragg reflector (DBR) structure in which dielectric layers having different refractive indices are alternately stacked. According to example embodiments, the semiconductor light emitting device 100 may further include a reflective metal layer disposed on at least one layer of the interlayer insulating layer 160.

Figure 2A:
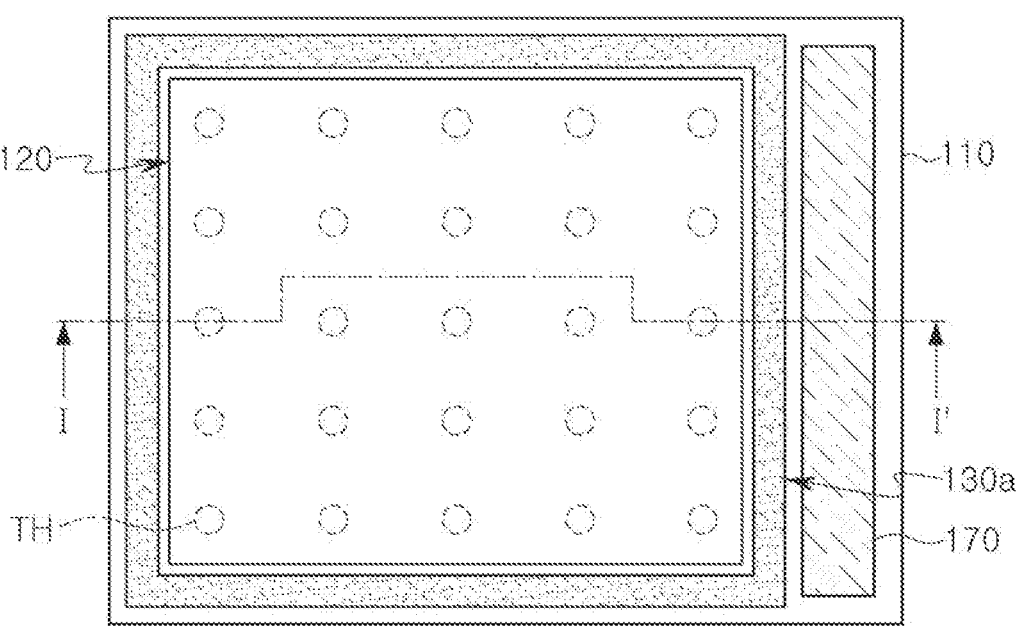
FIGS. 2A and 2B are a plan view and a cross-sectional view, respectively, of a semiconductor light emitting device according to example embodiments.
Figure 2A:
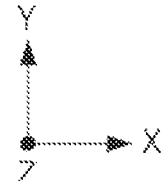
Figure 2B:
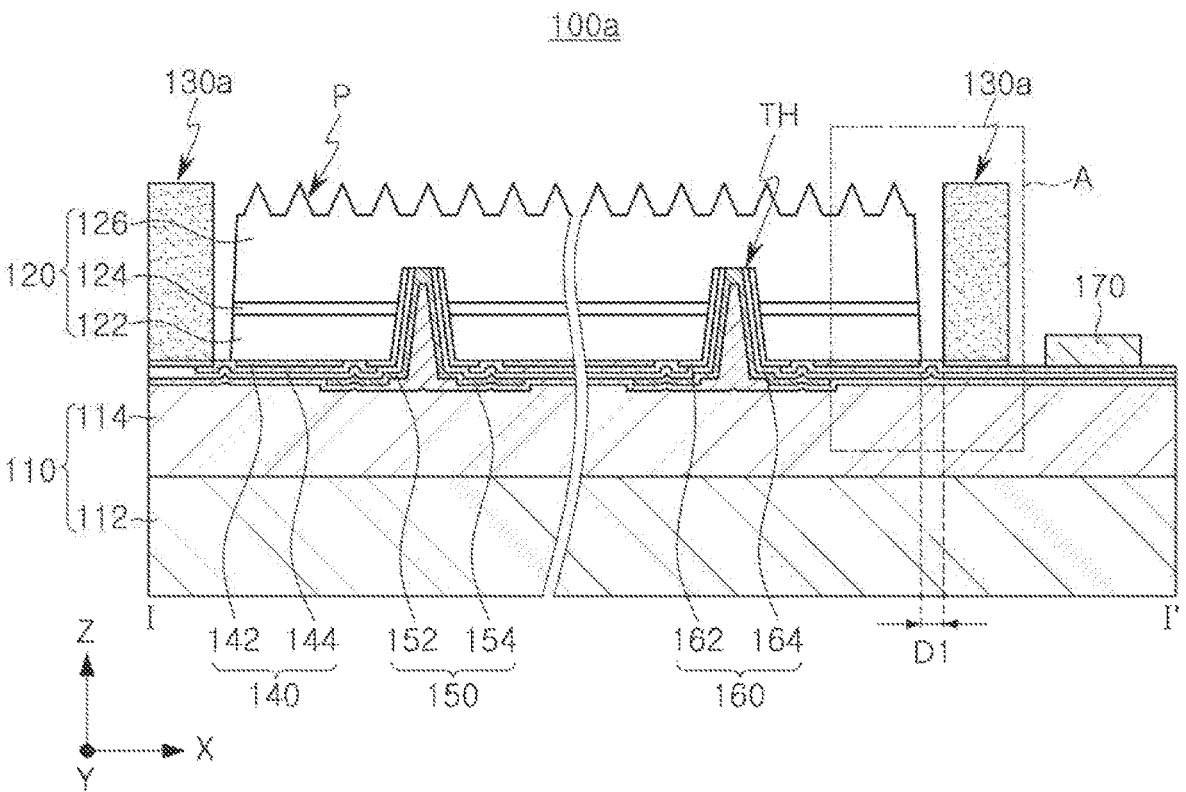

FIGS. 2A and 2B are a plan view and a cross-sectional view, respectively, of a semiconductor light emitting device according to example embodiments. FIG. 2B is a cross-sectional view taken along line I-I' of FIG. 2A.

Referring to FIGS. 2A and 2B, in a semiconductor light emitting device 100a, a dam structure 130a may be disposed to be spaced apart from a light emitting structure 120. The dam structure 130a may be spaced apart from the light emitting structure 120 to surround the light emitting structure 120. A distance D1 between the dam structure 130a and the light emitting structure 120 may vary in example embodiments as long as distance D1 is sufficient to electrically separate the dam structure 130 from the light emitting structure 120. The dam structure 130a may have substantially the same height as the light emitting structure 120. According to example embodiments, the dam structure 130a may have an inclined side surface.

The dam structure 130a may have a structure, independent of the light emitting structure 120, and may include materials different from the light emitting structure 120. For example, the dam structure 130a may be formed of a high-reflectivity material. In this case, light extraction efficiency may be further improved. The dam structure 130a may include a metallic material, for example, aluminum (Al), ruthenium (Ru), rhodium (Rh), gold (Au), silver (Ag), platinum (Pt), nickel (Ni), chromium (Cr), titanium (Ti), and copper (Cu). The dam structure 130a may be electrically separated from the first electrode 140 and the second electrode 150 by an interlayer insulating layer 160.

Figure 3A:
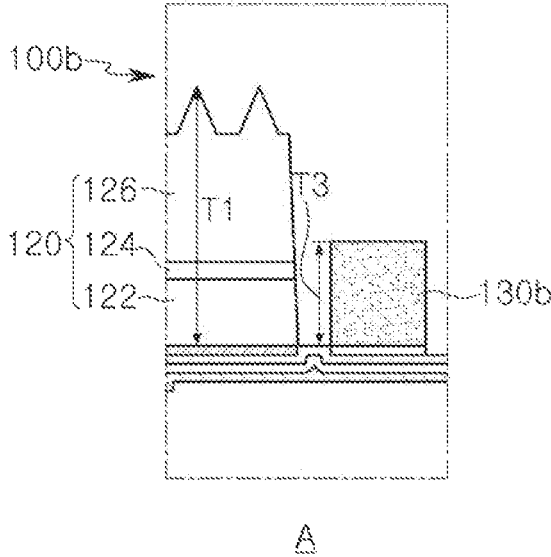
FIGS. 3A and 3B are partially enlarged views of certain portions of a semiconductor light emitting device according to example embodiments.
Figure 3B:
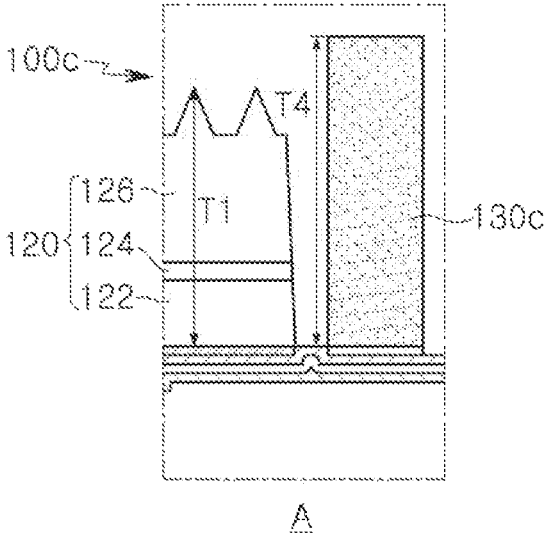

As discussed above, the dam structure 130a may have substantially the same height as the light emitting structure 120. However, example embodiments are not limited thereto. FIGS. 3A and 3B are partially enlarged views of certain portions of a semiconductor light emitting device according to example embodiments in which the dam structure has a height that is different from the light emitting structure 120. FIGS. 3A and 3B are enlarged views of a region corresponding to region 'A' of FIG. 2B.

Referring to FIG. 3A, in a semiconductor light emitting device 100b, a height T3 of a dam structure 130b may be smaller than a height T1 of a light emitting structure 120. For example, the height T3 of the dam structure 130b may be smaller than the height T1 of the light emitting structure 120 while being about 15% or more of the height T1 of the light emitting structure 120.

Referring to FIG. 3B, in a semiconductor light emitting device 100c, the height T4 of a dam structure 130c may be greater than a height T1 of a light emitting structure 120. For example, the height T4 of the dam structure 130c may be greater than the height T1 of the light emitting structure 120 while being less than or equal to about 120% of the height T1 of the light emitting structure 120.

As described above, the heights of the dam structures 130a, 130b, and 130c may vary in example embodiments of the semiconductor light emitting device.

Figure 4:
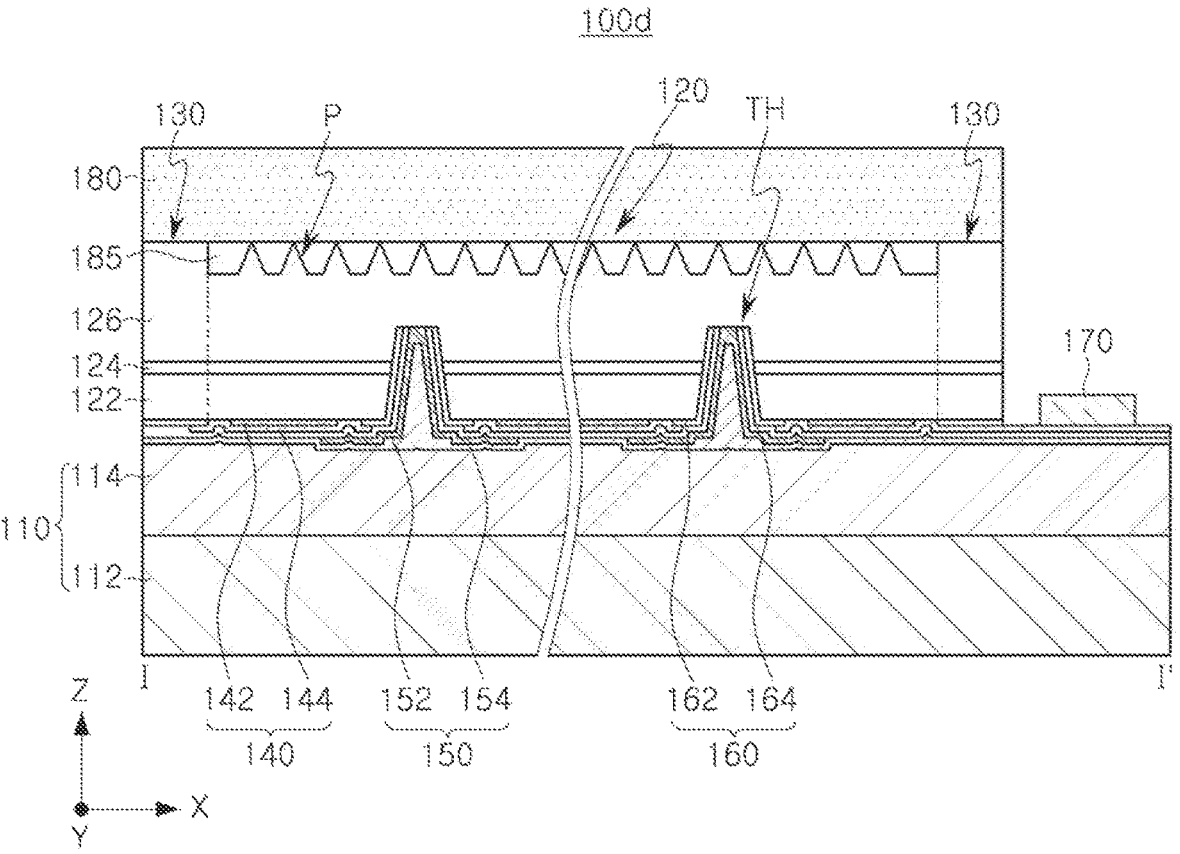
FIG. 4 is a cross-sectional view of a light emitting device package according to example embodiments.

FIG. 4 is a cross-sectional view of a light emitting device package according to example embodiments.

Referring to FIG. 4, in contrast to the example embodiment of FIG. 1B, a semiconductor light emitting device 100d may further include a wavelength conversion layer 180. The wavelength conversion layer 180 may be disposed on a light emitting structure 120 and a dam structure 130, and may be configured to convert a wavelength of light emitted from an active layer 124. The wavelength conversion layer 180 may include a wavelength conversion material, such as a phosphor or quantum dot material, to convert a wavelength of light generated from the light emitting structure 120.

The wavelength conversion layer 180 may be disposed to be in contact with an upper surface of the dam structure 130. According to example embodiments, the wavelength conversion layer 180 may be disposed to be in contact with an upper end of uneven portions P of the light emitting structure 120. According to example embodiments, the wavelength conversion layer 180 may be disposed to not be in contact with the upper end of the uneven portions P of the light emitting structure 120. A side surface of the wavelength conversion layer 180 may be substantially coplanar with an external side surface of the dam structure 130. An adhesive layer 185 may be provided in and may fill a space between the wavelength conversion layer 180 and the light emitting structure 120. The adhesive layer 185 may be, for example, a curable resin material such as transparent silicone, but example embodiments are not limited thereto. The wavelength conversion layer 180 may also be provided on the semiconductor light emitting devices 100a, 100b and 100c, discussed above with reference to FIGS. 2A, 2B, 3A and 3B.

In the semiconductor light emitting device 100d, the dam structure 130 may prevent a material of the adhesive layer 182 from flowing outwardly during a process of adhering the wavelength conversion layer 180 to the light emitting structure 120 and the dam structure 130. Thus, uniformity of application of the adhesive layer 185 may be improved, and the uneven portions P may be protected from being damaged by the wavelength conversion layer 180. Accordingly, a decrease in luminous flux, caused by the material of the adhesive layer 185, may be prevented, and defects such as cracking may be prevented from occurring in the light emitting structure 120. As a result, the light extraction efficiency and color distribution of the semiconductor light emitting device 100d may be further improved.

Figure 5:
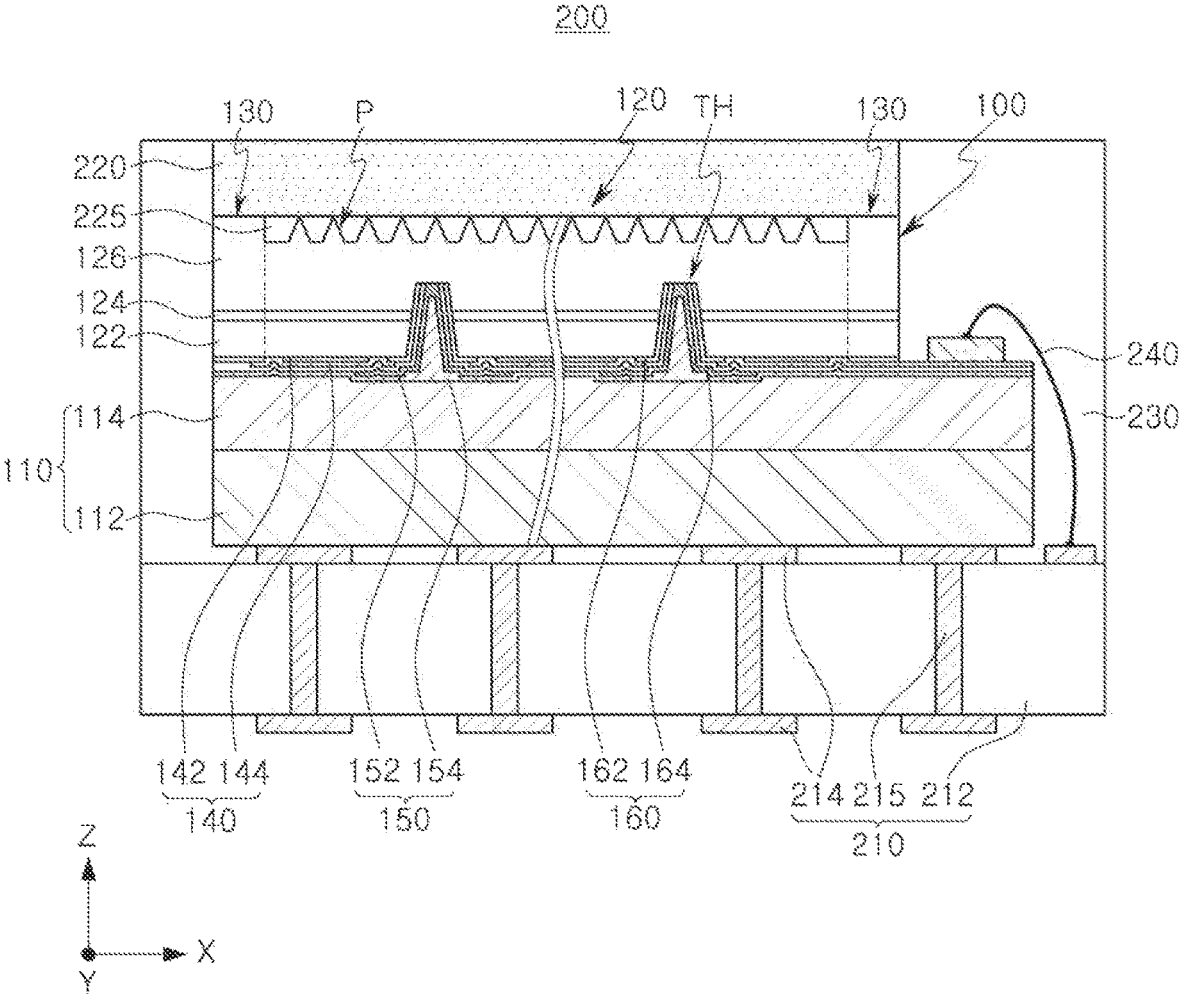
FIG. 5 is a cross-sectional view of a light emitting device package according to example embodiments.

FIG. 5 is a cross-sectional view of a light emitting device package according to example embodiments.

Referring to FIG. 5, a light emitting device package 200 may include a package substrate 210, a semiconductor light emitting device 100 mounted on the package substrate 210, a wavelength conversion portion 220 disposed on the semiconductor light emitting device 100, a reflective resin portion 230 disposed to surround the semiconductor light emitting device 100 and the wavelength conversion portion 220, and a wire 240 connecting the semiconductor light emitting device 100 and the package substrate 210 to each other. The descriptions provided above with reference to FIGS. 1A and 1B may be equally applied to the semiconductor light emitting device 100.

The package substrate 210 may include a body portion 212, wiring layers 214, respectively disposed on upper and lower surfaces of the body portion 212, and through-vias 215 penetrating through the body portion 212. The package substrate 210 may be electrically connected to the semiconductor light emitting device 100 through wiring layers 214 and the wire 240. The package substrate 210 may be a ceramic substrate including an aluminum nitride (AlN), but example embodiments are not limited thereto. According to example embodiments, the package substrate 210 may be a substrate including a lead frame, and other components such as a Zener diode may be additionally mounted on the package substrate 210 in addition to the semiconductor light emitting device 100.

The wavelength conversion portion 220 may be disposed on the semiconductor light emitting device 100 inside the reflective resin portion 230. Specifically, the wavelength conversion portion 220 may be disposed on the light emitting structure 120 and the dam structure 130 of the semiconductor light emitting device 100, and may be configured to convert a wavelength of light emitted from an active layer 124. The wavelength conversion portion 220 may include a wavelength conversion material such as a phosphor or quantum dot material configured to convert a wavelength of light generated from the light emitting structure 120.

The wavelength conversion portion 220 may be disposed to be in contact with an upper surface of the dam structure 130. According to example embodiments, the wavelength conversion portion 220 may be disposed to be in contact with an upper end of the uneven portions P of the light emitting structure 120. According to example embodiments, the wavelength conversion portion 220 may be disposed to not be in contact with the upper end of the uneven portions P of the light emitting structure 120. A side surface of the wavelength conversion portion 220 may be in contact with an internal side surface of the reflective resin portion 230. The side surface of the wavelength conversion portion 220 may be substantially coplanar with an external side surface of the dam structure 130. The wavelength conversion portion 220 may be disposed to overlap the light emitting structure 120 and the dam structure 130 with substantially the same size as the light emitting structure 120 and the dam structure 130 in an x-y plane. A space between the wavelength conversion portion 220 and the light emitting structure 120 may include, for example may be filled with, an adhesive layer 225. The adhesive layer 225 may be, for example, a resin-based material such as transparent silicone, but example embodiments are not limited thereto.

The reflective resin portion 230 may be disposed to surround the semiconductor light emitting device 100 and the wavelength conversion portion 220. The reflective resin portion 230 may be in contact with at least a portion of an external side surface of the semiconductor light emitting device 100 and a side surface of the wavelength conversion portion 220. An internal side surface of the reflective resin portion 230 may be in contact with the side surface of the wavelength conversion portion 220 and the external side surface of the dam structure 130. Accordingly, the dam structure 130 of the semiconductor light emitting device 100 may be interposed between the light emitting structure 120 and the reflective resin portion 230. The reflective resin portion 230 may have a greater height than the dam structure 130.

The reflective resin portion 230 may include a resin such as white silicone, and may further include light reflective particles such as TiO$_2$ and Al$_2$O$_3$. In FIG. 5, the reflective resin portion 230 is illustrated as extending between the package substrate 210 and the semiconductor light emitting device 100, but a shape of the reflective resin portion 230 is not limited thereto. According to example embodiments, an additional adhesive layer or an additional insulating layer may be further interposed between the package substrate 210 and the semiconductor light emitting device 100.

In the light emitting device package 200, the dam structure 130 may prevent a material of the adhesive layer 225 from flowing outwardly during a process of adhering the wavelength conversion portion 220 to the light emitting structure 120 and the dam structure 130. Thus, uniformity of application of the adhesive layer 225 may be improved, and the uneven portions P may be protected from being damaged by the wavelength conversion portion 220. Accordingly, a decrease in luminous flux, caused by the material of the adhesive layer 225, may be prevented and defects such as cracking may be prevented from occurring in the light emitting structure 120. As a result, the light extraction efficiency and color distribution of the light emitting device package 200 may be further improved.

Figure 6:
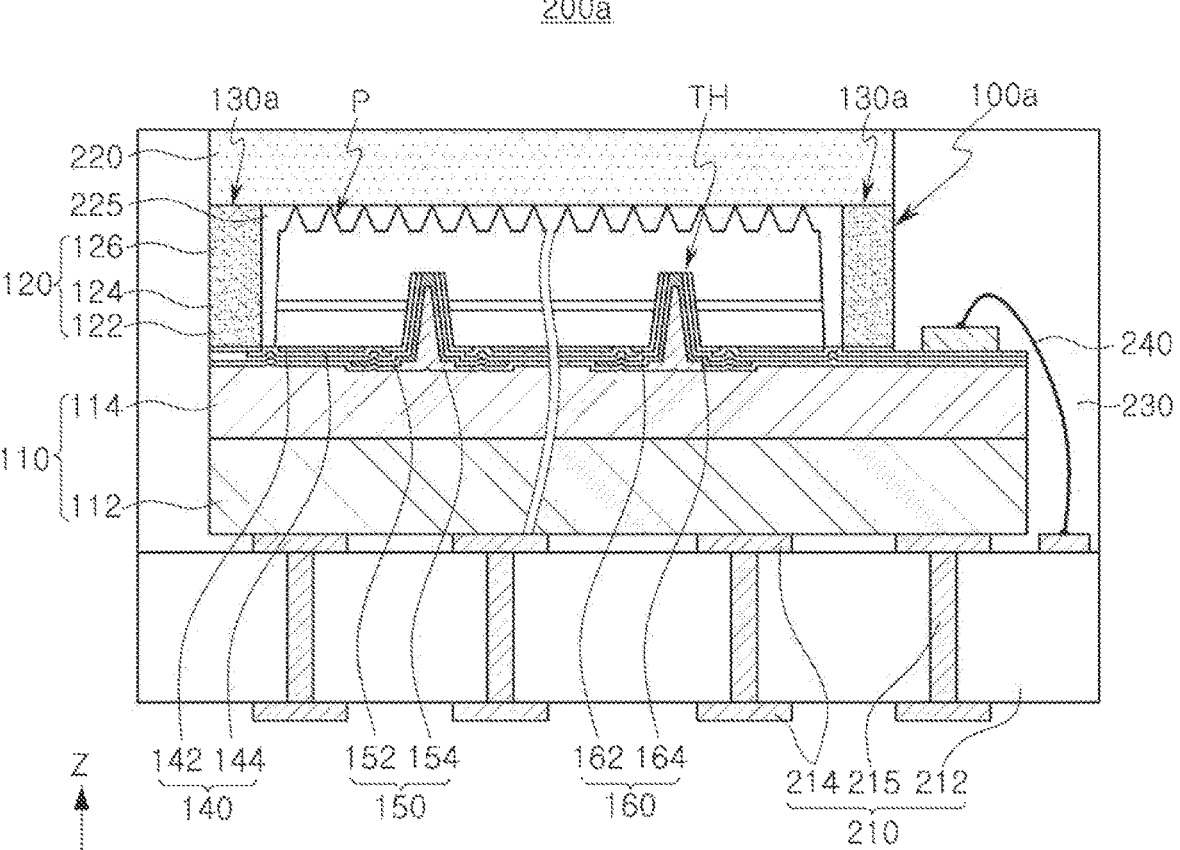
FIG. 6 is a cross-sectional view of a light emitting device package according to example embodiments.

FIG. 6 is a cross-sectional view of a light emitting device package according to example embodiments.

Referring to FIG. 6, a light emitting device package 200a may include a package substrate 210, a semiconductor light emitting device 100a, a wavelength conversion portion 220, a reflective resin portion 230, and a wire 240. In contrast to the example embodiment of FIG. 5, the light emitting device package 200a may include a semiconductor light emitting device 100a discussed above with reference to FIGS. 2A and 2B. The descriptions provided above with reference to FIGS. 2A and 2B may be equally applied to the semiconductor light emitting device 100a.

The dam structure 130a may be interposed between the light emitting structure 120 and the reflective resin portion 230. The dam structure 130a may be disposed to be spaced apart from the light emitting structure 120 and to be in contact with the reflective resin portion 230.

In example embodiments, the light emitting device package may include semiconductor light emitting devices 100b and 100c discussed above with reference to FIGS. 3A and 3B, other than the example embodiments of FIGS. 2A and 2B. According to a simulation result for a structure of the light emitting device package, as compared with a comparative example without a dam structure, luminous flux increased in example embodiments including the dam structures 130a, 130b, and 130c of FIGS. 2A, 2B, 3A and 3B. In example embodiments, luminous flux was more increased in the range of about 1.5% to 2% more than in the comparative example. Specifically, as in the example embodiment of FIG. 2B, when the dam structure 130a has the same height as the light emitting structure 120, luminous flux was increased most to 101.9% of that of the comparative example. In the case of the dam structures 130b and 130c discussed above with reference to FIGS. 3A and 3B, it was confirmed that luminous flux was increased by about 101.6% of that of the comparative example.

Figure 7:
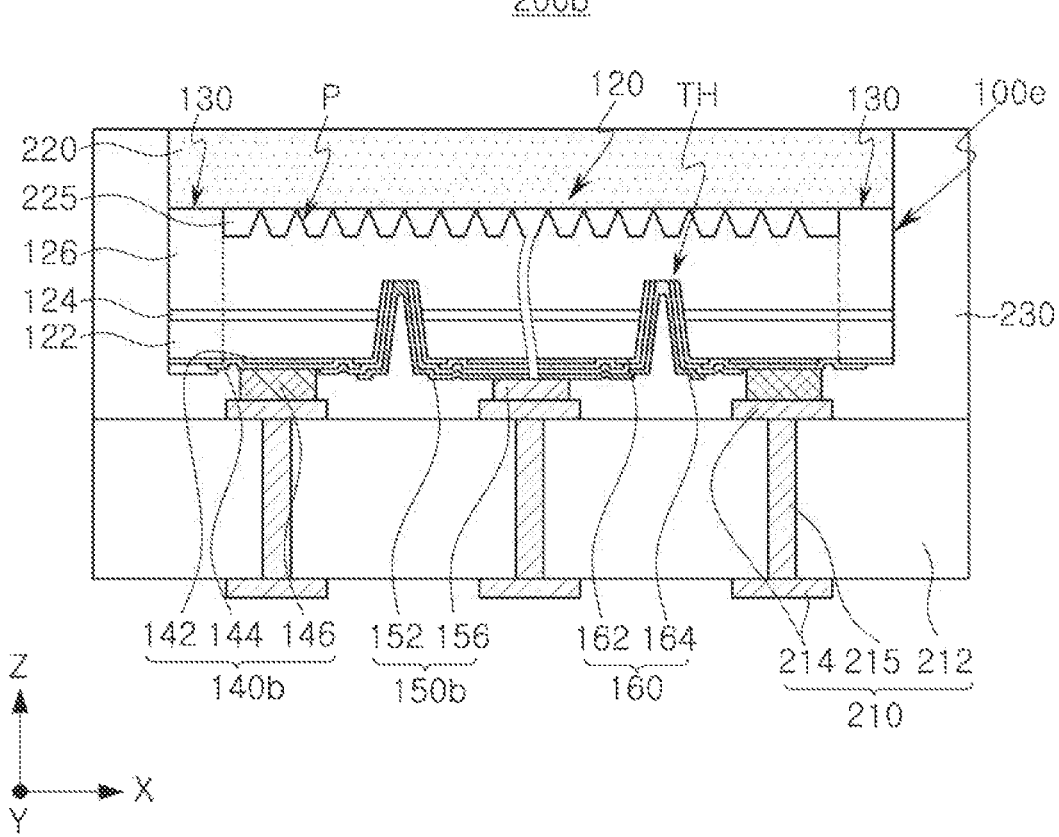
FIG. 7 is a cross-sectional view of a light emitting device package according to example embodiments.

FIG. 7 is a cross-sectional view of a light emitting device package according to example embodiments.

Referring to FIG. 7, a light emitting device package 200b may include a package substrate 210, a semiconductor light emitting device 100e, a wavelength conversion portion 220, and a reflective resin portion 230. The semiconductor light emitting device 100e may include a light emitting structure 120, a dam structure 130, a first electrode 140b and a second electrode 150b connected to the light emitting structure 120, and an interlayer insulating layer 160 in contact with the first electrode 140b and the second electrode 150b. The first electrode 140b and the second electrode 150b may be disposed on a lower surface of the light emitting structure 120, and may be connected to wiring layers 214 of the package substrate 210, below the light emitting structure 120.

The first electrode 140b may include first contact electrodes 142 disposed on a lower surface of a first conductivity-type semiconductor layer 122, a first connection electrode 144 disposed on lower surfaces of the first contact electrodes 142 to connect the first contact electrodes 142 to each other, and a first pad electrode 146 disposed on a lower surface of the first connection electrode 144 and connected to wiring layers 214.

The second electrode 150b may include a second contact electrode 152, connected to the second conductivity-type semiconductor layer 126 through a plurality of holes TH, and a second pad electrode 156 disposed on a lower surface of the second contact electrode 152 to be connected to the wiring layers 214. According to example embodiments, the second electrode 150b may also further include a connection electrode between the second contact electrode 152 and the second pad electrode 156.

The interlayer insulating layer 160 may include a first interlayer insulating layer 162, disposed between the first electrode 140b and the light emitting structure 120, and a second interlayer insulating layer 146 disposed between the first electrode 140b and the second electrode 150b.

According to example embodiments, the light emitting structure 120 may include a plurality of LED cells separated along a stacked direction. In this case, each of the plurality of LED cells may be surrounded by the dam structure 130. In addition, the first electrode 140b and the second electrode 150b may include a plurality of independent electrodes, respectively corresponding to the plurality of LED cells, to selectively drive the plurality of LED cells.

FIGS. 8A, 8B, 8C, 8D, 8E and 8F are cross-sectional views illustrating a method of manufacturing a light emitting device package according to example embodiments. In FIGS. 8A, 8B, 8C, 8D, 8E and 8F, a method of manufacturing a semiconductor light emitting device discussed above with reference to FIG. 1B will be described.

Figure 8A:
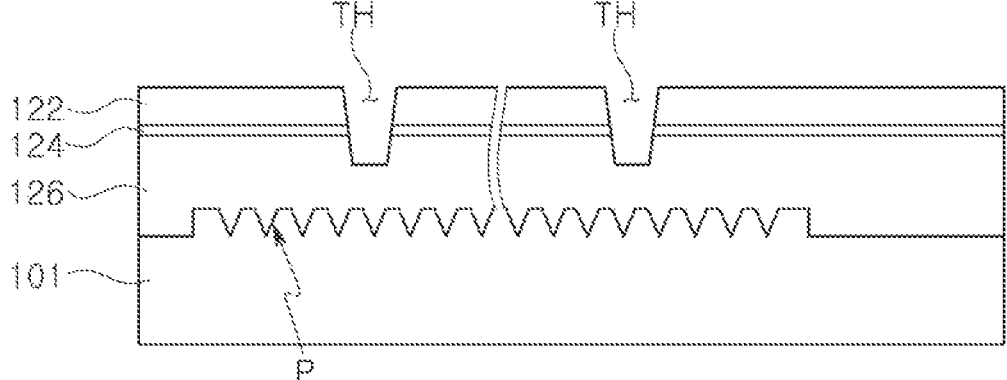
FIGS. 8A, 8B, 8C, 8D, 8E and 8F are cross-sectional views illustrating a method of manufacturing a light emitting device package according to example embodiments.

Referring to FIG. 8A, a second conductivity-type semiconductor layer 126, an active layer 124, and a first conductivity-type semiconductor layer 122 may be sequentially formed on a growth substrate 101 to form a stacked structure, and a plurality of holes TH may be formed.

The growth substrate 101 may be for growth of a nitride single crystal and may include any one or any combination of, for example, sapphire, Si, SiC, MgAl$_2$O$_4$, MgO, LiAlO$_2$, LiGaO$_2$, and GaN. The growth substrate 101 may have an uneven structure on an upper surface thereof in a certain region, for example, a region in which the light emitting structure 120 of FIG. 1B is to be formed. Such an uneven structure may improve crystallinity and light extraction efficiency of semiconductor layers constituting the light emitting structure 120.

According to example embodiments, a buffer layer may be further formed before the second conductivity-type semiconductor layer 126 is formed on the growth substrate 101. In this case, the buffer layer may reduce lattice defects of the second conductivity-type semiconductor layer 126 and may include an undoped nitride semiconductor such as undoped GaN, undoped AlN, and undoped InGaN.

The stacked structure may constitute the light emitting structure 120 and the dam structure 130 of FIG. 1B through a subsequent process. The second conductivity-type semiconductor layer 126, the active layer 124, and the first conductivity-type semiconductor layer 122 may be formed using a metal organic chemical vapor deposition (MOCVD) process, a hydrogen vapor phase epitaxy (HVPE) process, or a molecular beam epitaxy (MBE) process. The second conductivity-type semiconductor layer 126 may be an n-type nitride semiconductor layer such as n-type GaN, and the first conductivity-type semiconductor layer 122 may be a p-type nitride semiconductor layer such as p-type GaN/p-type AlGaN. The active layer 124 may have a multiple quantum well structure such as InGaN/GaN. Due to the uneven structure, uneven portions P may also be formed on a lower surface of the second conductivity-type semiconductor layer 126. However, according to example embodiments, the uneven portions P may be formed in an operation to be described later with reference to FIG. 8F.

Holes TH may be formed through the first conductivity-type semiconductor layer 122, the active layer 124 and a portion of the second conductivity-type semiconductor layer 126 to expose a certain region of the second conductivity-type semiconductor layer 126. A process of forming the holes TH may be implemented by an etching process of removing certain regions of the first conductivity-type semiconductor layer 122 and the active layer 124. A region of the second conductivity-type semiconductor layer 126, exposed by the holes TH, may be provided as a region for forming the second electrode 150 (see FIG. 1B).

Figure 8B:
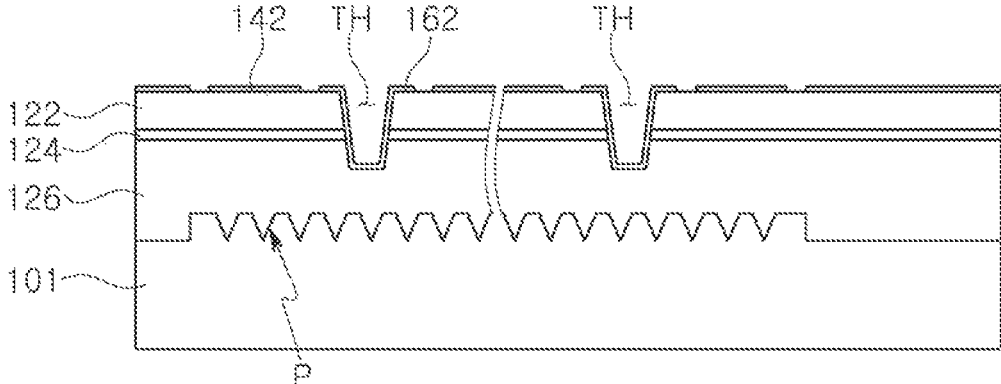

Referring to FIG. 8B, first contact electrodes 142 may be formed to be connected to the first conductivity-type semiconductor layer 122, and a first interlayer insulating layer 162 may be formed in the holes TH.

The first contact electrodes 142 may include, for example, an ohmic contact material. According to example embodiments, the first contact electrodes 142 may be transparent electrodes. For example, the transparent electrode may include ITO, ZITO, ZIO, GIO, ZTO, FTO, AZO, GZO, $In_4Sn_3O_{12}$, or $Zn_{1-x}Mg_xO$ ($0 \le x \le 1$).

The first interlayer insulating layer 162 may be deposited in the holes TH and may be formed so as not to overlap the first contact electrodes 142. For example, the first interlayer insulating layer 162 may include $SiO_2$, SiN, $SiO_xN_y$, $TiO_2$, $Si_3N_4$, $Al_2O_3$, TiN, AlN, $ZrO_2$, TiAlN, TiSiN, HfO, $NbO_2$, $TaO_2$, or $MgF_2$.

Figure 8C:
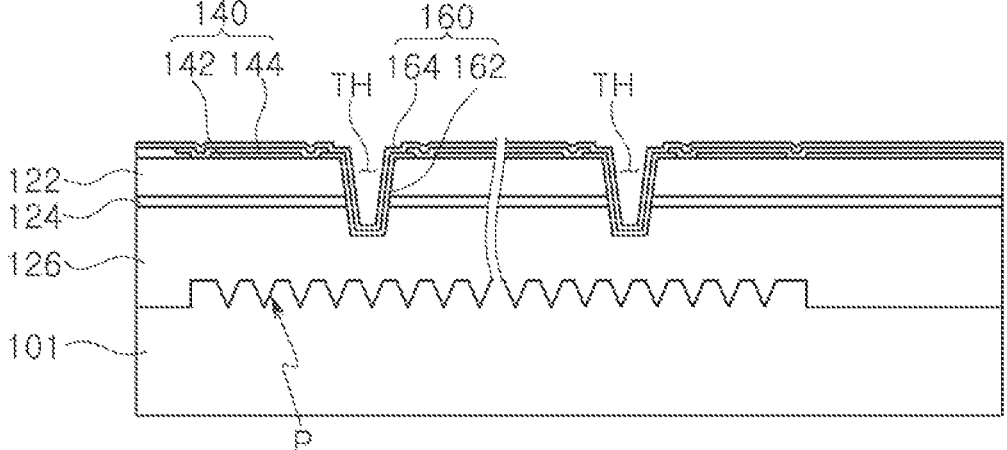

Referring to FIG. 8C, a first connection electrode 144 may be provided to form a first electrode 140, and a second interlayer insulating layer 164 may be formed on the first electrode 140.

The first connection electrode 144 may be formed on the first contact electrodes 142 to connect the first contact electrodes 142 to each other. For the first connection electrode 144, for example, the electrode material described above for the first contact electrodes 142 may be used, or a metallic material may be used as the reflective electrode.

The second interlayer insulating layer 164 may be formed to cover the first electrode 140 and to extend into the holes TH. For the second interlayer insulating layer 164, the above-mentioned insulating material for the first interlayer insulating layer 162 may be used. The second interlayer insulating layer 164 may ensure insulation between the second electrode 150 to be formed in a subsequent process and the first electrode 140. Accordingly, an interlayer insulating layer 160 including the first interlayer insulating layer 162 and the second interlayer insulating layer 164 may be formed.

Figure 8D:
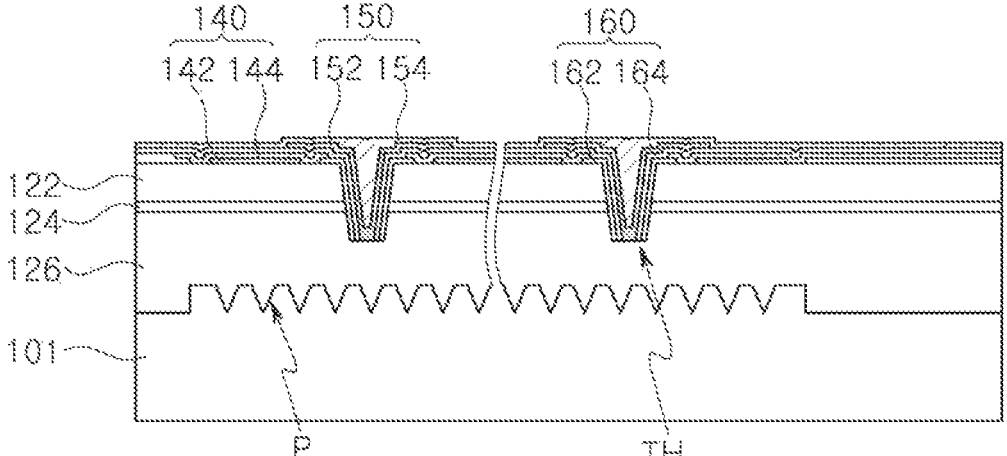

Referring to FIG. 8D, second contact electrodes 152 and a second connection electrode 154 may be provided to form a second electrode 150.

In the holes TH, a portion of the interlayer insulating layer 160 may be removed to expose the second conductivity-type semiconductor layer 126.

Second contact electrodes 152 may be formed in the holes TH to be connected to the exposed second conductivity-type semiconductor layer 126 and a second connection electrode 154 may be formed to connect the second contact electrodes 152 to each other.

Figure 8E:
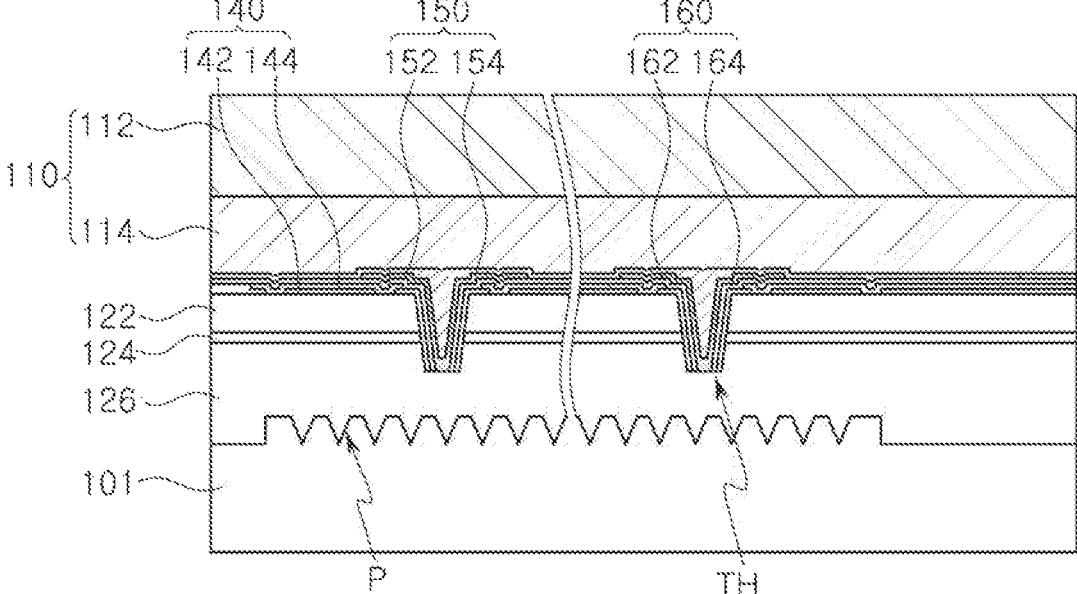

Referring to FIG. 8E, a substrate structure 110 may be formed on the stacked structure, the first electrode 140, and the second electrode 150.

The substrate structure 110 may be formed by bonding the support substrate 112 to the second electrode 150 using a bonding metal layer 114. For example, the support substrate 112 may be a conductive substrate such as a silicon (Si) substrate, and the bonding metal layer 114 may be a bonding metal such as Au, Sn, Ni, Au—Sn, Ni—Sn, or Ni—Au—Sn.

Figure 8F:
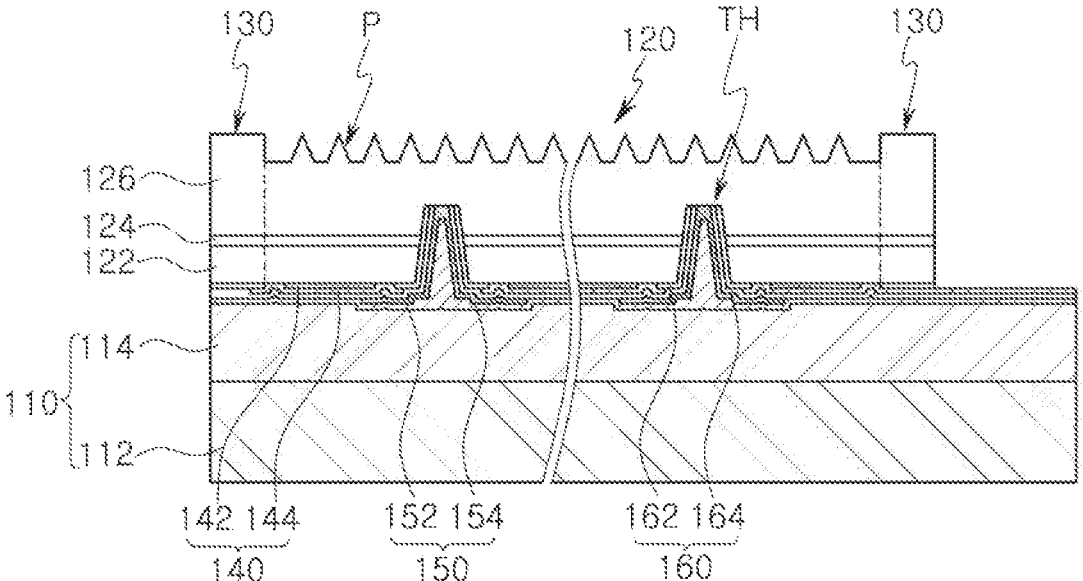

Referring to FIG. 8F, the growth substrate 101 may be removed from the stacked structure, and the stacked structure may be etched to form a light emitting structure 120 and a dam structure 130.

The removal of the growth substrate 101 may be performed by various processes such as a laser lift-off process, a mechanical polishing or chemical mechanical polishing process, or an etching process. For example, when the growth substrate 101 is a silicon substrate, the growth substrate 101 may be removed by a mechanical or chemical mechanical polishing process. When the growth substrate 101 is a sapphire substrate, the growth substrate 101 may be removed by a laser lift-off process.

A portion of the stacked structure may be removed by an etching process. Accordingly, the light emitting structure 120 and the dam structure 130 may be formed, and a portion of the first electrode 140 may be upwardly exposed on one side of the light emitting structure 120. For example, the dam structure 130 may be provided between the light emitting structure 120 and the upwardly exposed portion of the first electrode 140. An upper surface of the light emitting structure 120 may be a surface on which the growth substrate 101 is removed, and may be a surface on which the uneven portions P are formed. The dam structure 130 may be connected to the light emitting structure 120, and may be provided in a region in which the uneven portions P are not formed on an upper surface thereof.

In the case of the example embodiment of FIG. 2B, in the present operation, a portion of the stacked structure may be removed, and the dam structure 130 may be formed by a deposition process, or the like.

Referring to FIGS. 1B and 8F, an electrode pad 170 may be formed on the exposed first electrode 140. Accordingly, the semiconductor light emitting device 100 of FIG. 1B may be manufactured.

Figure 9A:
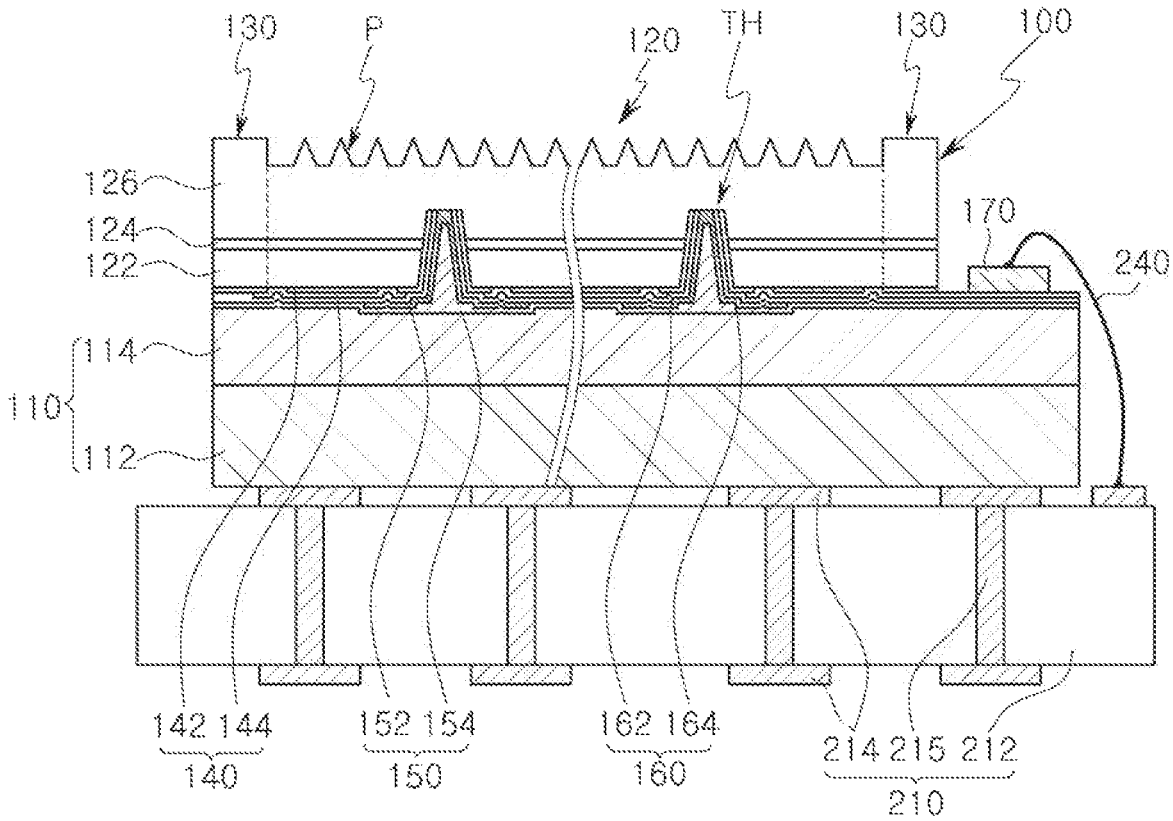
FIGS. 9A, 9B and 9C are cross-sectional views illustrating a method of manufacturing a light emitting device package according to example embodiments.
Figure 9B:
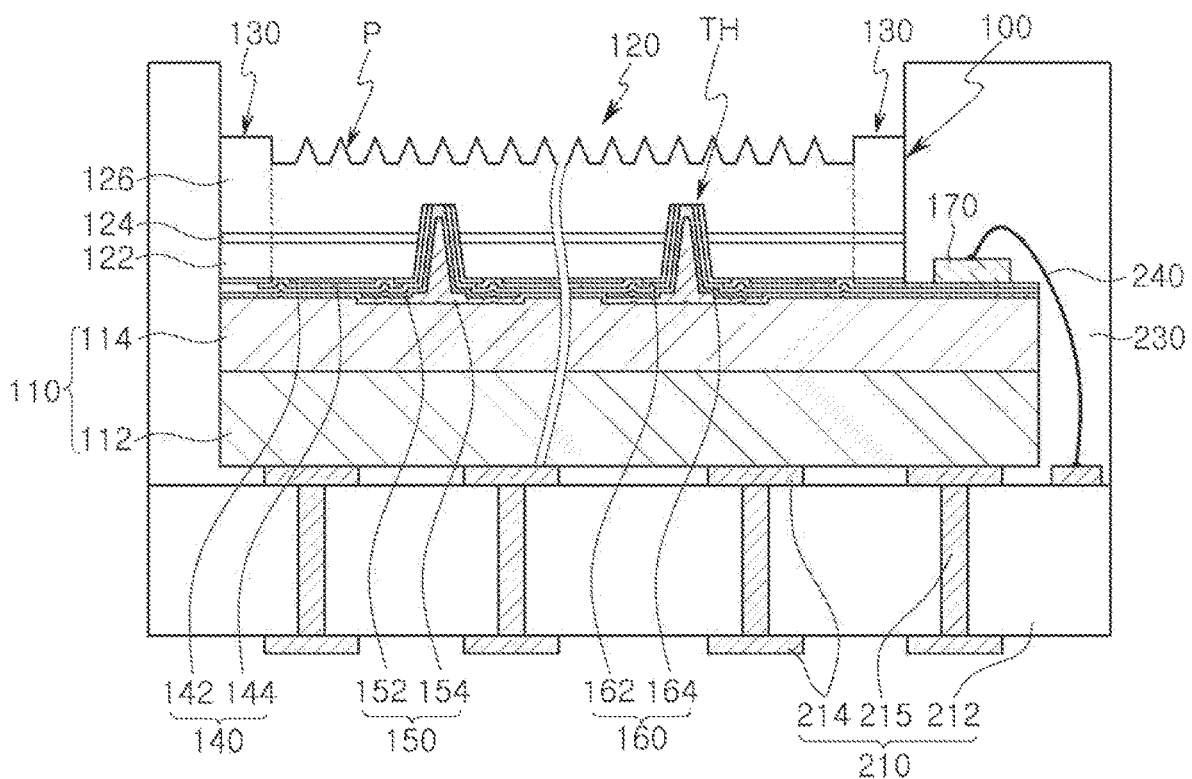
Figure 9C:
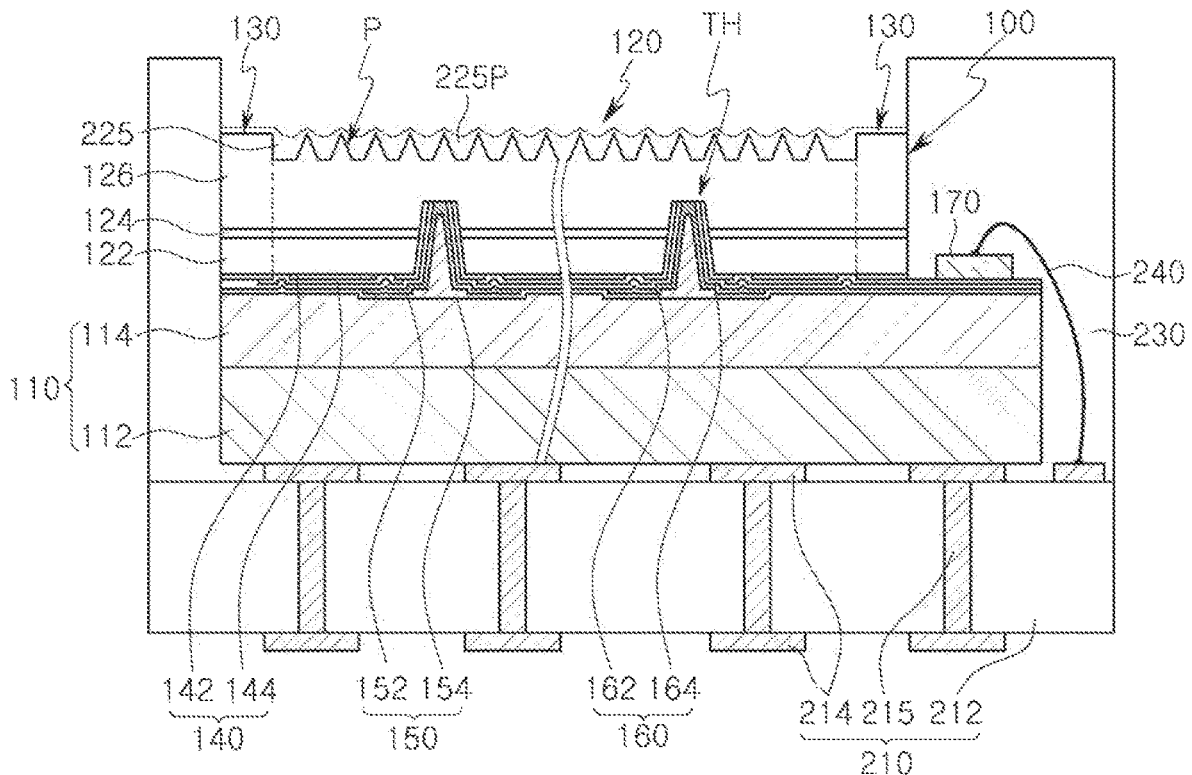

FIGS. 9A, 9A and 9C are cross-sectional views illustrating a method of manufacturing a light emitting device package according to example embodiments. In FIGS. 9A, 9B and 9C, a method of manufacturing the light emitting device package of the example embodiment of FIG. 5 will be described as an example.

Referring to FIG. 9A, a semiconductor light emitting device 100 may be mounted on a package substrate 210.

A bonding process may be performed to connect wiring layers 214 of the package substrate 210 to a substrate structure 110 of the semiconductor light emitting device 100. The bonding process may use, for example, eutectic bonding. However, according to example embodiments, an additional ball or bonding layer may be interposed between the wiring layers 214 and the substrate structure 110. An electrode pad 170 and the wiring layer 214 may be connected using a wire 240.

Referring to FIG. 9B, a reflective resin portion 230 may be formed to surround the semiconductor light emitting device 100.

The reflective resin portion 230 may be formed to cover external side surfaces of a dam structure 130, a first electrode 140, a second electrode 150, an interlayer insulating layer 160, and the substrate structure 110 of the semiconductor light emitting device 100. The reflective resin portion 230 may be formed to encapsulate the electrode pad 170 and the wire 240.

The reflective resin portion 230 may be formed to be higher than an upper surface of the dam structure 130, and thus, may provide a region in which a wavelength conversion portion 220 (see FIG. 5) may be formed.

Referring to FIG. 9C, an adhesive material 225P, which may be used to adhere the wavelength conversion portion 220 onto the semiconductor light emitting device 100, may be provided on the light emitting structure 120 and the dam structure 130.

The adhesive material 225P may form a cured adhesive layer 225 (see FIG. 5). In the present operation, the dam structure 130 may be disposed on a periphery of the light emitting structure 120 to prevent the adhesive material 225P from flowing outwardly along an end portion of the light emitting structure 120 or to prevent the adhesive material 225P from being non-uniformly applied. In addition, the reflective resin portion 230 may be prevented from permeating to the light emitting structure 120. Thus, light extraction efficiency and color distribution may be prevented from decreasing in the light emitting structure 120.

Referring to FIG. 5 together with FIG. 9C, the wavelength conversion portion 220 may be adhered onto the light emitting structure 120 and the dam structure 130. In the present operation, the dam structure 130 may be disposed on the periphery of the light emitting structure 120 to prevent the wavelength conversion portion 220 from damaging the uneven portions P by pressing the uneven portions P. Thus, cracking may be prevented to occurring in the light emitting structure 120, so that a decrease in light extraction efficiency may be prevented.

Figure 10:
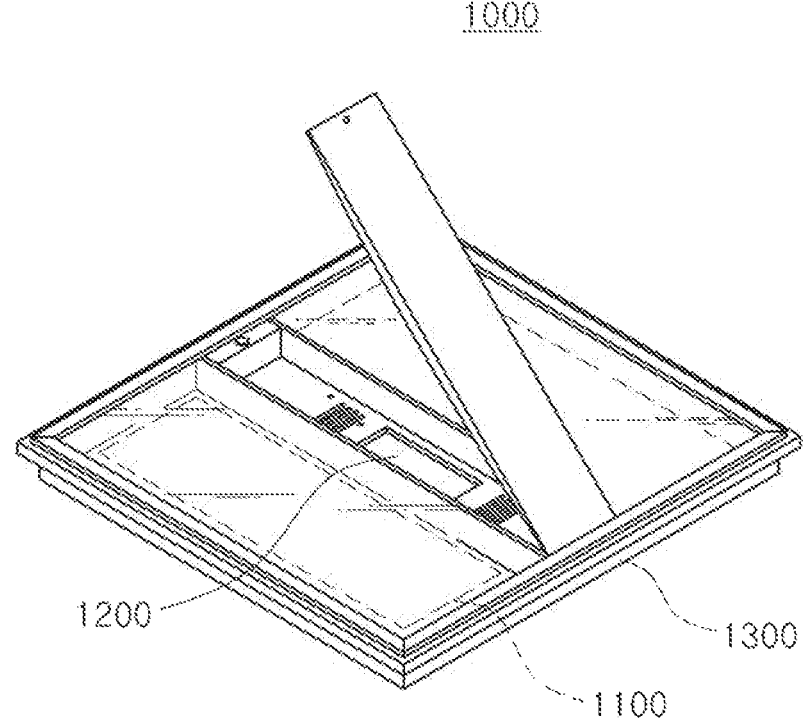
FIG. 10 is a schematic perspective view of a planar lighting device according to example embodiments.

FIG. 10 is a schematic perspective view of a planar lighting device according to example embodiments.

Referring to FIG. 10, a planar lighting device 1000 may include a light source module 1100, a power supply unit 1200, and a housing 1300.

The light source module 1100 may include a light source array, and may be formed to have an overall flat plate shape. A light source, constituting the light source module 1100, may be configured to include the semiconductor light emitting devices 100, 100a, 100b, 100c, and 100d of FIGS. 1A, 1B, 2A, 2B, 3A, 3B and 4, or may be configured to include the light emitting device packages 200, 200a, and 200b of FIGS. 5 to 7.

The power supply unit 1200 may be configured to supply power to the light source module 1100, and may include a driving control unit (e.g., a hardware driver). An accommodation space may be formed in the housing 1300 to accommodate the light source module 1100 and the power supply unit 1200. The housing 1300 may have a hexahedral shape having an open side surface, but example embodiments are not limited thereto. The light source module 1100 may be disposed to emit light to the open side surface of the housing 1300.

Figure 11:
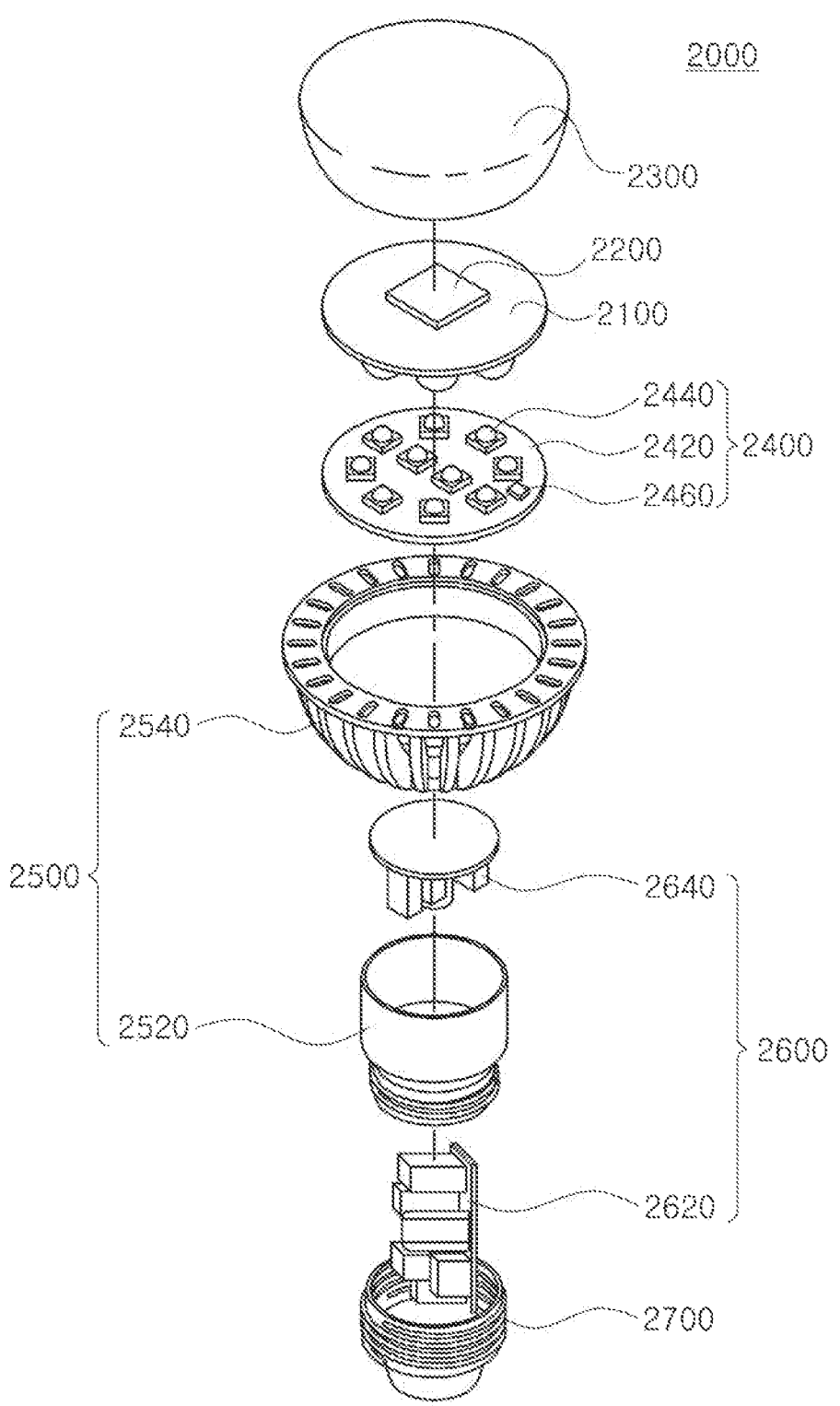
FIG. 11 is an exploded perspective view of a bulb-type lighting device according to example embodiments.

FIG. 11 is an exploded perspective view of a bulb-type lighting device according to example embodiments.

Referring to FIG. 11, a lighting device 2000 may include a socket 2700, a power supply unit 2600, a heat dissipation unit 2500, a light source module 2400, and a cover unit 2300.

Power, supplied to the lighting device 2000, may be applied through the socket 2700. The socket 2700 may be configured to be replaceable with an existing lighting device. As illustrated in the drawing, the power supply unit 2600 may be separated into a first power supply unit 2620 and a second power supply unit 2640, and may be then assembled. The heat dissipation unit 2500 may include an internal heat dissipation unit 2520 and an external heat dissipation unit 2540. The internal heat dissipation unit 2520 may be directly connected to the light source module 2400 and/or the power supply unit 2600, allowing heat to be transferred to the external heat dissipation unit 2540. The cover unit 2300 may be configured to uniformly distribute light emitted by the light source module 2400.

The light source module 2400 may receive power from the power supply unit 2600 to emit light to the cover unit 2300. The light source module 2400 may include one or more light sources 2440, a circuit board 2420, and a controller 2460. The controller 2460 may store driving data of the light source 2440. Each of the light sources 2440 may be configured to include the semiconductor light emitting devices 100, 100a, 100b, 100c, and 100d of FIGS. 1A, 1B, 2A, 2B, 3A, 3B and 4, or may be configured to include the light emitting device packages 200, 200a, and 200b of FIGS. 5 to 7.

The lighting device 2000 may further include a reflection plate 2100 disposed above the light source module 2400. The reflection plate 2100 may uniformly spread light from the light source to a side surface and a rear surface to reduce glare.

A communications module 2200 may be further mounted on the reflection plate 2100, and home-network communications may be implemented through the communications module 2200. For example, the communications module 2200 may be a wireless communications module using Zigbee, WiFi, or LiFi, and may control lightings mounted inside and outside the home, for example, may control turn-on/off, brightness, and the like, of a lighting device through a smartphone or a wireless controller. In addition, electronic products and vehicle systems inside and outside the home, such as TVs, refrigerators, air conditioners, door locks, and vehicles, may be controlled by a Li—Fi communications module using a visible light wavelength of a lighting device installed inside and outside the home. The reflection plate 2100 and the communications module 2200 may be covered with the cover unit 2300.

Figure 12:
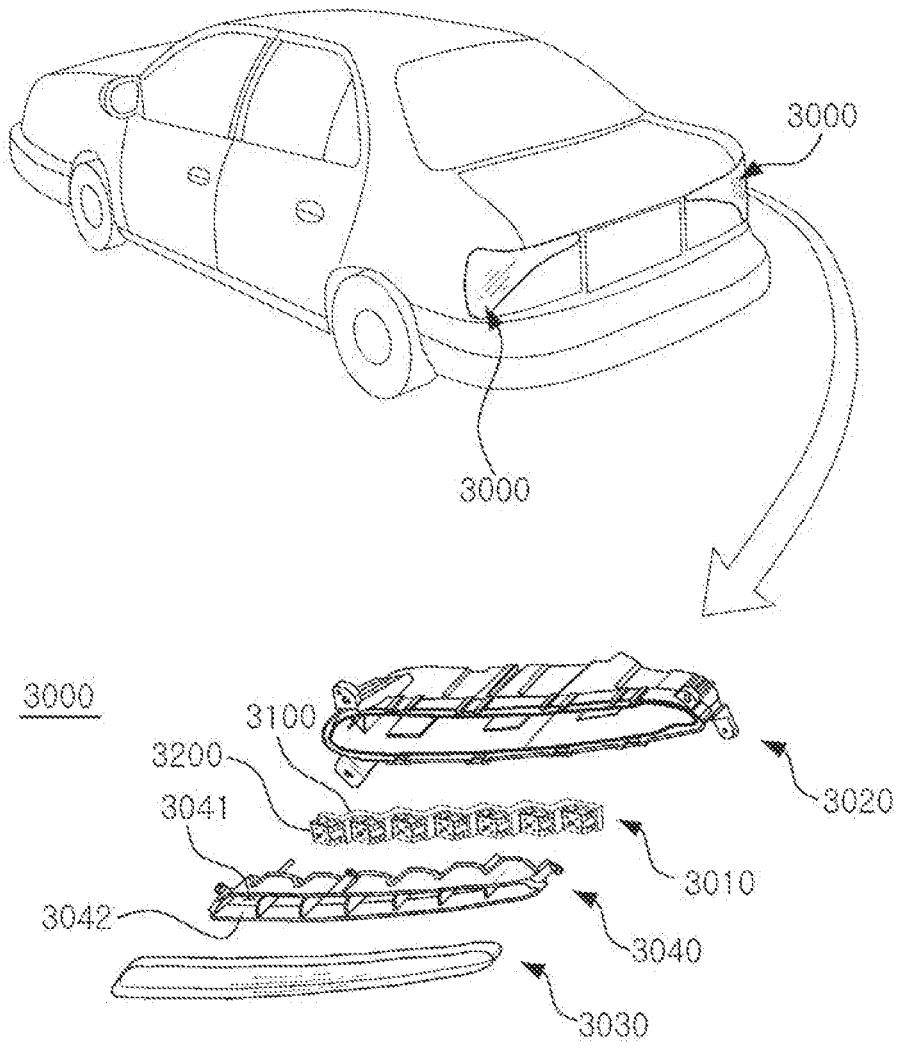
FIG. 12 is a schematic view of a lighting device according to example embodiments.

FIG. 12 is a schematic view of a lighting device according to example embodiments. The lighting device may include, for example, a rear lamp of a vehicle.

Referring to FIG. 12, a lighting device 3000 may include a housing 3020, to which a light source module 3010 is supported, and a cover 3030 covering the housing 3020 to protect the light source module 3010, and may further include a reflection plate 3040 disposed on the light source module 3010. The reflection plate 3040 may have a plurality of reflective surfaces 3042 and a plurality of through-holes 3041, respectively provided on bottom surfaces of the reflective surfaces 3042. A plurality of light emitting units 3200 of the light source module 3010 may each be exposed to the reflective surface 3042 through the through-hole 3041. Each of the plurality of light emitting units 3200 may be configured to include the semiconductor light emitting devices 100, 100*a*, 100*b*, 100*c*, and 100*d* of FIGS. 1A, 1B, 2A, 2B, 3A, 3B and 4, or may be configured to include the light emitting device packages 200, 200*a*, and 200*b* of FIGS. 5 to 7.

The lighting device 3000 may have a smoothly curved structure overall to correspond to a shape of a corner portion of the vehicle. Accordingly, the light emitting unit 3200 may be assembled to a frame 3100 to fit the curved structure of the lighting device 3000 to form a light source module 3010 having a step structure corresponding to the curved structure. A structure of the light source module 3010 may be variously modified depending on designs of the lighting device 3000, for example, the rear lamp. In addition, the number of assembled light emitting units 3200 may vary accordingly.

The lighting device 3000 is illustrated as being the rear lamp of the vehicle, but example embodiments are not limited thereto. For example, the lighting device 3000 may include a headlamp of the vehicle and a turn signal lamp mounted on a door minor of the vehicle. In this case, the light source module 3010 may be formed to have a multistage structure corresponding to curved surfaces of the headlamp and the turn signal lamp.

As described above, a semiconductor light emitting device may include a dam structure surrounding at least a portion of a light emitting structure. Accordingly, a light emitting device having improved light extraction efficiency and a light emitting device package having the semiconductor light emitting device may be provided.

While example embodiments have been shown and described above, it will be apparent to those of ordinary skill in the art that modifications and variations could be made without departing from the scope of the appended claims.

What is claimed is:

1. A semiconductor light emitting device comprising:
a substrate structure comprising a conductive structure;
a light emitting structure comprising a first conductivity-type semiconductor layer, an active layer, and a second conductivity-type semiconductor layer sequentially provided on the substrate structure, wherein the first conductivity-type semiconductor layer comprises an upper surface and a lower surface, the active layer is provided on the upper surface of the first conductivity-type semiconductor layer, a hole penetrates through the first conductivity-type semiconductor layer and the active layer to expose the second conductivity-type semiconductor layer, and uneven portions are provided on a surface of the second conductivity-type semiconductor layer;
a dam structure provided adjacent a portion of the light emitting structure on the substrate structure, wherein the dam structure comprises a conductivity-type semiconductor layer;
a wavelength conversion portion provided on the light emitting structure and in contact with an upper surface of the dam structure;
a first electrode provided between the substrate structure and the lower surface of the first conductivity-type semiconductor layer, and connected to the first conductivity-type semiconductor layer; and a second electrode provided in the hole between the substrate structure and the light emitting structure, and connected to the second conductivity-type semiconductor layer,
wherein the dam structure comprises an outer side surface that is substantially perpendicular to an upper surface of the substrate structure.

2. The semiconductor light emitting device of claim 1, wherein the active layer extends through the light emitting structure and the dam structure, and
wherein the lower surface of the first conductivity-type semiconductor layer is between the substrate structure and the upper surface of the first conductivity-type semiconductor layer.

3. The semiconductor light emitting device of claim 1, wherein the dam structure and the light emitting structure have substantially similar heights.

4. The semiconductor light emitting device of claim 1, wherein the first electrode is provided between the light emitting structure and the second electrode.

5. The semiconductor light emitting device of claim 1, wherein the first electrode comprises a connection electrode extending to a side of the light emitting structure, and
wherein the semiconductor light emitting device further comprises an electrode pad provided on the connection electrode.

6. The semiconductor light emitting device of claim 1, wherein the outer side surface of the dam structure and a side surface of the wavelength conversion portion are substantially coplanar.

7. The semiconductor light emitting device of claim 1, wherein each of the first electrode and the second electrode extends between the substrate structure and the dam structure.

8. The semiconductor light emitting device of claim 7, wherein the second electrode is electrically connected to the conductive structure of the substrate structure.

9. The semiconductor light emitting device of claim 1, wherein a height of the dam structure is less than a height of the light emitting structure.

10. The semiconductor light emitting device of claim 1, wherein a width of an upper portion of the dam structure is equal to a width of a lower portion of the dam structure.

11. A light emitting device package comprising:
a package substrate including a wiring layer provided on an upper surface of the package substrate;
a semiconductor light emitting device provided on the package substrate;
a wavelength conversion portion provided on the semiconductor light emitting device; and
a reflective resin portion provided on the package substrate adjacent the semiconductor light emitting device and the wavelength conversion portion, and in contact with the upper surface of the package substrate,
wherein the semiconductor light emitting device comprises:
a substrate structure comprising a conductive structure;
a light emitting structure comprising a first conductivity-type semiconductor layer, an active layer, and a second conductivity-type semiconductor layer sequentially provided on the substrate structure, wherein the first conductivity-type semiconductor layer comprises an upper surface and a lower surface, the active layer is provided on the upper surface of the first conductivity-type semiconductor layer, a hole penetrates through the first conductivity-type semiconductor layer and the active layer to expose the second conductivity-type semiconductor layer, and uneven portions are provided on a surface of the second conductivity-type semiconductor layer;

a dam structure provided adjacent a portion of the light emitting structure on the substrate structure, wherein the dam structure comprises a conductivity-type semiconductor layer;

a first electrode provided between the substrate structure and the lower surface of the first conductivity-type semiconductor layer, and connected to the first conductivity-type semiconductor layer; and a second electrode provided in the hole between the substrate structure and the light emitting structure and connected to the second conductivity-type semiconductor layer, wherein an external side surface of the dam structure is in contact with the reflective resin portion, and wherein a width of an upper portion of the dam structure is equal to a width of a lower portion of the dam structure.

12. The light emitting device package of claim 11, wherein an internal side surface of the reflective resin portion is in contact with a side surface of the wavelength conversion portion and the external side surface of the dam structure.

13. The light emitting device package of claim 11, wherein the first conductivity-type semiconductor layer, the active layer, and the second conductivity-type semiconductor layer extend through the dam structure and the light emitting structure.

14. The light emitting device package of claim 13, wherein in the dam structure, the second conductivity-type semiconductor layer has a substantially planar upper surface.

15. The light emitting device package of claim 11, further comprising an adhesive layer provided between the light emitting structure and the wavelength conversion portion, wherein the adhesive layer is in contact with the dam structure.

16. A light emitting device package comprising:
a package substrate;
a semiconductor light emitting device provided on the package substrate;
a wavelength conversion portion provided on the semiconductor light emitting device; and
a reflective resin portion provided on the package substrate adjacent the semiconductor light emitting device and the wavelength conversion portion, and in contact with an upper surface of the package substrate, wherein the semiconductor light emitting device comprises:

a substrate structure comprising a conductive structure;

a light emitting structure comprising a first conductivity-type semiconductor layer, a second conductivity-type semiconductor layer, and an active layer on the substrate structure, wherein the first conductivity-type semiconductor layer comprises an upper surface and a lower surface, the active layer is provided on the upper surface of the first conductivity-type semiconductor layer provided between the first conductivity-type semiconductor layer and the second conductivity-type semiconductor layer;

a dam structure provided adjacent a portion of the light emitting structure on the substrate structure, wherein the dam structure comprises a conductivity-type semiconductor layer;

a first electrode provided between the substrate structure and the lower surface of the first conductivity-type semiconductor layer, and connected to the first conductivity-type semiconductor layer; and a second electrode provided between the substrate structure and the light emitting structure, and connected to the second conductivity-type semiconductor layer, wherein the dam structure is provided between the light emitting structure and the reflective resin portion, and wherein a height of the dam structure is equal to or less than a height of the light emitting structure.

17. The light emitting device package of claim 16, wherein uneven portions are provided on an upper surface of the light emitting structure, and the dam structure has a planar upper surface.

18. The light emitting device package of claim 16, wherein the dam structure is connected to the light emitting structure.

19. The light emitting device package of claim 16, wherein the dam structure includes an outer side surface that is substantially perpendicular to an upper surface of the substrate structure.

20. The light emitting device package of claim 16, wherein a width of an upper portion of the dam structure is equal to a width of a lower portion of the dam structure.

* * * * *